United States Patent
Motoki et al.

(10) Patent No.: US 6,468,882 B2
(45) Date of Patent: Oct. 22, 2002

(54) METHOD OF PRODUCING A SINGLE CRYSTAL GALLIUM NITRIDE SUBSTRATE AND SINGLE CRYSTAL GALLIUM NITRIDE SUBSTRATE

(75) Inventors: Kensaku Motoki, Itami (JP); Hitoshi Kasai, Itami (JP); Takuji Okahisa, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/901,119

(22) Filed: Jul. 10, 2001

(65) Prior Publication Data

US 2002/0028564 A1 Mar. 7, 2002

(30) Foreign Application Priority Data

Jul. 10, 2000 (JP) ......................................... 2000-207783

(51) Int. Cl.[7] ......................... H01L 21/46; H01L 21/78; H01L 21/301
(52) U.S. Cl. ........................................ 438/460; 438/479
(58) Field of Search .......................... 438/44, 47, 458, 438/460, 479, 481, 931, 967, 465, 478

(56) References Cited

U.S. PATENT DOCUMENTS

| | | | | |
|---|---|---|---|---|
| 5,909,036 A | * | 6/1999 | Tanaka et al. ................. | 257/94 |
| 5,928,421 A | | 7/1999 | Yuri et al. ..................... | 117/97 |
| 6,225,650 B1 | * | 5/2001 | Tadatomo et al. ............ | 257/190 |
| 6,294,440 B1 | * | 9/2001 | Tsuda et al. .................. | 438/479 |
| 6,320,209 B1 | * | 11/2001 | Hata et al. .................... | 257/190 |

FOREIGN PATENT DOCUMENTS

| | | |
|---|---|---|
| EP | 0 942 459 A1 | 9/1999 |
| EP | 0 966 047 A2 | 12/1999 |
| EP | 1 088 914 A1 | 4/2001 |
| JP | 2001-102307 | 4/2001 |

OTHER PUBLICATIONS

Akai Usui. "Thick Layer Growth of GaN by Hydride Vapor Phase Epitaxy" *Collection of Theses of Electronic Information Communication Society* C–II vol. J81–C–II, No. 1 Jan. 1998, pp. 58–64 and its English translation.
Ro Sakai et al. "Decrease of Dislocation Density by GaN Epitaxial Lateral Overgrowth" *J.J. Appl. Phys.* vol. 68, No. 7, 1999, pp. 774–779 and its English translation.
PCT Gazette of Int'l Appln. No. PCT/JP98/04908 which claims priority of Japanese Patent Appln No. 9–298300, Japanese Patent Appln No. 10–9008, and Japanese Patent Appln No. 10–102546.
International Search Report for corresponding European Appln No. EP 01 11 6827 dated Nov. 6, 2001.
K. Hiramatsu et al. Fabrication and characterization of low defect density GaN using facet–controlled epitaxial lateral overgrowth (FACELO) *Journal of Crystal Growth* vol. 221, No. 1–4, Dec. 2000, pp. 316–326.
A. Usui. "Growth of Thick GaN Layers by Hydride Vapor––Phase Epitaxy" *Electronics and Communications in Japan* Part 2, vol. 18, No. 7, 1998 pp. 58–61.
Patent Abstracts of Japan, vol. 1999, No. 02 for JP 10 312971 published Nov. 24, 1998.

* cited by examiner

*Primary Examiner*—David Nelms
*Assistant Examiner*—Phuc T. Dang
(74) *Attorney, Agent, or Firm*—Smith, Gambrell, & Russell, LLP

(57) ABSTRACT

GaN single crystal substrates are produced by slicing a GaN single crystal ingot in the planes parallel to the growing direction. Penetration dislocations which have been generated in the growing direction extend mainly in the bulk of the GaN substrate. A few of the threading dislocations appear on the surface of the GaN substrate. GaN substrates of low-dislocation density are obtained.

21 Claims, 13 Drawing Sheets

(1)

(2)

(3)

(4)

(1)

(2)

(3)

(1)

(2)

(3)

(4)

(1)

(2)

(3)

Single step process

Double step process

Triple step process

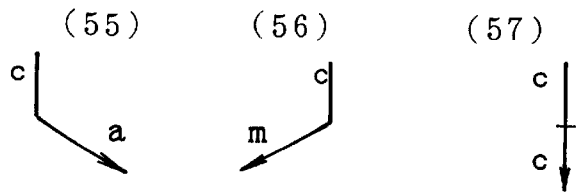
Fig. 19 EMBODIMENT 1
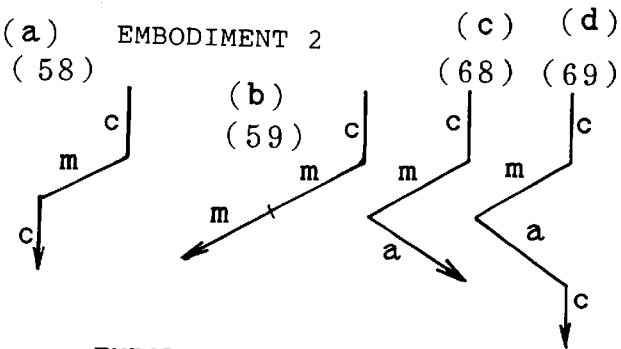
Fig. 20 EMBODIMENT 2
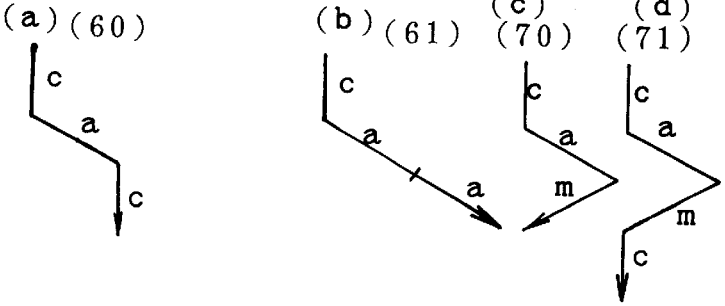
Fig. 21 EMBODIMENT 3
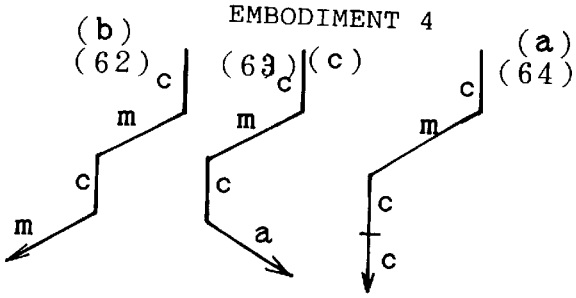
Fig. 22 EMBODIMENT 4
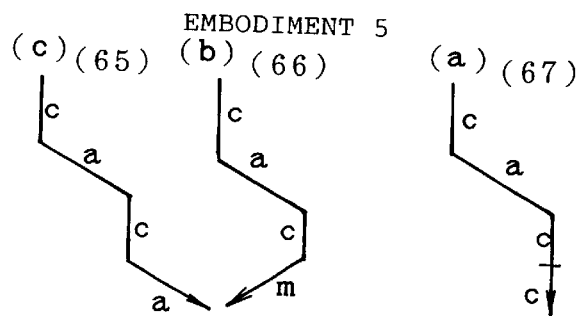
Fig. 23 EMBODIMENT 5

METHOD OF PRODUCING A SINGLE CRYSTAL GALLIUM NITRIDE SUBSTRATE AND SINGLE CRYSTAL GALLIUM NITRIDE SUBSTRATE

BACKGROUND OF THE INVENTION

1. Field of the Invention

This invention relates to a method of producing a single crystal gallium nitride (GaN) substrate and a gallium nitride substrate itself for making light emitting devices of light emitting diodes (LEDs) or laser diodes (LDs) built with the nitride semiconductors consisting of the group 3-5 elements. Gallium nitride and the like (GaInN, AlInN, InAlGaN) are semiconductors having wide band gaps which correspond to blue light or blue/green light.

This application claims the priority of Japanese Patent Application No. 2000-207783 filed on Jul. 10, 2000 which is incorporated herein by refernce.

2. Description of Related Art

Blue-light LEDs making use of the nitride semiconductor (GaN, GaInN, AlInN, AlInGaN) have been already put into practice on mass scale. There is no natural single crystal GaN mineral. It has been impossible to grow gallium nitride (GaN) single crystal ingots from a GaN melt, since heating converts solid phase GaN directly into vapor phase GaN without a liquid phase. Almost all of the nitride semiconductor LEDs on sale are produced upon sapphire ($\alpha$-Al$_2$O$_3$) monocrystal (single crystal) substrates. Sapphire belongs to a trigonal symmetry group.

The GaN LEDs are fabricated by piling n-type or p-type films of GaN, GaInN, AlInN, InAlGaN or so (called "GaN type films" collectively) heteroepitaxially upon single crystal sapphire substrates. The GaN type crystals have hexagonal symmetry. GaN belongs to a different symmetry group from sapphire. Single crystal sapphire, however, turned out a very stable, suitable material as a substrate which allows the GaN type films to grow heteroepitaxially. The excellency of sapphire allows device makers to produce a plenty of inexpensive blue light or blue-green light GaN/sapphire LEDs.

However, sapphire is a very rigid material. A sapphire single crystal has no cleavage plane. Cleavage is a convenient property for cutting a wide device-made wafer into individual device chips and for making resonator mirrors of laser diodes. Lack of natural cleavage compels device makers to cut (dice) mechanically sapphire wafers crosswise and lengthwise into device chips with an application of strong forces. The dicing process incurs an extra cost and decreases a yield in the production of GaN LEDs. Uncleavability of GaN crystals subjects GaN/sapphire LDs to other difficulties besides the problems of dicing. Uncleavable GaN prevents GaN laser diodes from making resonator mirrors by natural cleavage, which invites difficulties on laser oscillation performance and on production cost.

Another difficulty originates from the fact that sapphire is an insulator. Electrical insulation of sapphire prohibits the on-sapphire LEDs from taking a vertical electrode structure which allocates top and bottom surfaces for two electrodes (anode and cathode). Instead of the common vertical electrode structure, the sapphire-carried LEDs take a horizontal electrode structure by etching partially upper films, revealing a part of an n-type GaN-type film, making a cathode on the n-type GaN-type film and producing an anode upon a top p-type GaN-type film. The n-type GaN-type film should be thick enough to allow current to flow in the horizontal direction. The n-type electrode pad should be bonded to a cathode pin by wirebonding. The extra etching, the extra thick film and an extra wirebonding raise the cost by increasing the time of fabrication and the number of steps. Furthermore, the larger chip surface required for allocating two electrodes on the same surface. This point incurs an increment of the cost.

The sapphire substrates are suffering from these difficulties. Someone proposes a use of silicon carbide (SiC) as a substrate for GaN light emitting devices (LEDs and LDs). Silicon carbide belongs to the hexagonal symmetry group like GaN. Natural cleavage accompanies a silicon carbide crystal. Natural cleavage will facilitate to cut a GaN optoelectronic device-loaded SiC wafer into individual device chips and will conveniently make resonator mirrors in GaN LDs. SiC is electrically conductive. The conductive SiC allows the vertical electrode structure which allocates top and bottom surfaces to an anode and a cathode. Silicon carbide substrates favor the fabrication process of making GaN type LEDs. Silicon carbide, however, has some drawbacks. Single crystal silicon carbide is highly expensive. The difficulty of producing SiC single crystals will jeopardize a continual, stable supply of SiC substrates. The crystalline property of GaN films grown on SiC substrates are still bad at present. SiC is not deemed to be the suitable material as a substrate of GaN light emission devices. SiC is rather inferior to sapphire as a substrate for GaN LEDs. GaN/SiC LEDs are not brought onto market yet.

Sapphire or silicon carbide as a substrate induces many dislocations and other defects in GaN type films grown thereupon owing to mismatches of lattice constants and thermal expansion coefficients between the upper films and the bottom substrate. GaN/sapphire LEDs on sale have about $1 \times 10^9$ cm$^{-2}$ dislocations in the GaN epitaxial films.

It is said that GaN films heteroepitaxially grown on silicon carbide (SiC) would have about $1 \times 10^8$ cm$^{-2}$. Plenty of dislocations induced in the GaN films cause no serious damage to the practical utility of the GaN/sapphire LEDs. The GaN/sapphire LEDs enjoy a long lifetime despite the affluence of dislocations.

However, in the case of GaN/sapphire LDs which require large current density, experiments clarify the fact that the big dislocation density forbids the on-sapphire GaN type LDs from having a long lifetime. The big current increases the dislocations and other defects. Furthermore, an LD requires resonator consisting of two parallel mirrors at both ends of a cavity. Sapphire substrates without cleavage require elaborate dicing and polishing for making flat smooth mirrors with high reflection. The fabrication of the resonator mirror would raise the cost of GaN/sapphire LDs. The high cost and short lifetime degrade sapphire as a substrate for GaN LDs. From the reasons, sapphire and silicon carbide are not the most suitable material for the substrates of GaN LDs.

The best substrate should be a gallium nitride (GaN) single crystal (monocrystal). If a wide GaN single crystal substrate were obtained, the problem of the mismatches of the lattice constant and the thermal expansion would be entirely solved. GaN has natural cleavage in {1-100} planes. GaN is a semiconductor. Impurity doped GaN substrates have enough conductivity. GaN substrates would be superior to sapphire substrates in cleavability and conductivity. Gallium nitride single crystals would be the most favorable substrates for GaN LDs. However, crystal growth technology has not been matured for GaN yet. It is difficult at present to produce gallium nitride single crystals with a large size sufficient for the substrates of GaN LDs.

Heating converts solid GaN not to liquid GaN but to vapor GaN. High pressure and high temperature are requisites for making a GaN melt. It is said that it would be possible to synthesize a gallium nitride single crystal from a GaN melt in a state of thermal equilibrium maintained by ultrahigh pressure and high temperature. However, even if it succeeded, the ultrahigh pressure method would synthesize only a small GaN crystal which would be insufficient for the substrate of GaN LDs. The inventors of the present invention are unaware of such a report of succeeding in making a GaN bulk single crystal by the ultrahigh pressure method. Such a liquid phase method is hopeless for supplying wide gallium nitride crystals on an industrial scale.

Someone suggested a method of covering a sapphire substrate with a mask having windows, piling gallium nitride molecules through the mask upon the sapphire substrate and making a GaN film on the sapphire in vapor phase. The mask having windows has an effect of reducing dislocations in the GaN film.

① Akira Usui, "Thick Layer Growth of GaN by Hydride Vapor Phase Epitaxy", Electric Information Communication Society, Vol.J81-C-II, No.1, p58–64 (1998, Jan).

② Akira Sakai, Akira Usui, "Decrease of the dislocation density by GaN epitaxial lateral overgrowth", Japanese Journal of Applied Physics, vol.68, No.7, p774–779 (1999).

The reports suggested improvements of the vapor phase growth of GaN film upon a sapphire substrate through a window-carrying mask. They adhered to sapphire substrates. It is impossible to eliminate the sapphire substrate from the GaN film, since there is no means of removing the hard, sturdy sapphire. Thus, the final product of ① and ② is an assembly of a sapphire substrate and a GaN crystal grown upon the sapphire.

The inventors of the present invention proposed methods of making a GaN film through window-carrying mask upon a gallium arsenide (GaAs) substrate, eliminating the GaAs substrate and obtaining a freestanding GaN single crystal.

③ Japanese Patent Application No.9-298300 (298300/'97)

④ Japanese Patent Application No.10-9008 (9008/'98)

The applications proposed methods of making a wide low-dislocation density GaN single crystal through the mask windows upon the GaAs substrate. The method of growing GaN through the window-carrying mask upon a substrate (sapphire or GaAs) is called "Epitaxial Lateral Overgrowth (ELO)".

The new ELO method proposed by ③ and ④ produces a gallium nitride single crystal by the steps of forming a mask having plenty of striped windows or round windows on a GaAs substrate, growing a GaT film through the windows of the mask by some method (e.g., HVPE, MOCVD, MOC, etc.) upon the GaAs substrate and removing the GaAs substrate.

Among the growth methods, the inventors prefer to the HVPE (hydride vapor phase epitaxy) method. Thus, the HVPE method is now described by referring to FIG. 1. A vertically long furnace 1 contains a Ga-boat 2 including a Ga melt 3 near the top. A susceptor 4 is furnished upon a top of a shaft near the bottom in the vertical furnace 1. A substrate 5 is mounted upon the susceptor 4. Here, the substrate is a (111) GaAs single crystal. A cylindrical heater 6 encloses the tall furnace 1. The top of the furnace 1 has two gas inlets 7 and 8. A first gas inlet 7 provides the Ga melt 3 in the furnace 1 with a mixture of hydrogen gas ($H_2$) and hydrochloric gas (HCl). HCl reacts with Ga and synthesizes gallium chloride (GaCl). GaCl molecules flow downward in gas phase toward the substrate 5 in the furnace 1. A second gas inlet 8 supplies a mixture of hydrogen gas ($H_2$) and ammonia gas ($NH_3$) to a middle space below the Ga boat 2 in the furnace 1. Reaction of gaseous GaCl with $NH_3$ synthesizes gallium nitride (GaN) and deposits GaN molecules upon the substrate 5. An exhaustion gas is exhaled via a gas outlet 9 out of the furnace 1.

Another basic technology is the Epitaxial Lateral Overgrowth (ELO). Prior art ③ and ④ reported the ELO in detail. The ELO is described by referring to FIG. 2 to FIG. 4. In FIG. 2, the underlying blank signifies a (111) gallium arsenide single crystal substrate 10. A thin hatched mask 11 overlays the (111) GaAs monocrystalline substrate. The mask 11 should be made of a material which forbids GaN from piling upon. For example, the mask 11 is made of SiN (silicon nitride). Many small windows 12 are regularly distributed crosswise and lengthwise on the mask 11 in certain periods in accordance with a rule. A series of windows align with a period L in a GaAs [11-2] direction. Another series of windows align with the same period by an off-set of L/2 in the same direction. Every three nearest neighbors form an equilateral triangle of a side of L. The distance between the neighboring parallel series is $3^{1/2}L/2$. The example of FIG. 2 has square windows. The shape of a window is arbitrary. The square windows can be replaced by round windows, striped windows or other polygon windows.

FIG. 3 shows a mask having many stripe windows arranged in a similar manner to the windows in FIG. 2. In FIG. 3, the underlaid blank means a (111) GaAs single crystal substrate wafer 10. The substrate wafer 10 is covered with the mask 11 having stripe-shaped (rectangular) windows 12.

A GaN film crystal is grown upon the masked GaAs wafer 10, for example, by the HVPE method. FIG. 4 shows a series of steps of piling the GaN layer upon the GaAs wafer. FIG. 4(1) is a section of the GaAs substrate wafer 10 covered with the mask 11 having the windows 12 before the growth. When the HVPE synthesizes GaN molecules, GaN grains grow only on the revealed portions of the GaAs substrate. FIG. 4(2) shows GaN cones 13 selectively formed upon the revealed GaAs parts. The mask has a function of excluding the piling of GaN. The mask 11 is free from GaN grains. The GaN cone 13 is a polygonal cone having {11-22} planes.

Thin vertical lines in the GaN cones 13 denote threading dislocations 14. The threading dislocations 14 extend in the growth direction. The defects are called "threading dislocations" 14 since the dislocations project upward by penetrating the successively growing layers. The underlying GaAs substrate crystal 10 determines crystallographical orientations of the GaN grains (cones) 13. FIG. 2 shows a GaAs [1-10] orientation and a GaAs [11-2] orientation. GaN crystals grow along a c-axis in a [0001] orientation. In FIG. 2, a GaN [1-210] orientation coincides with the GaAs [1-10] orientation. A GaN [10-10] orientation coincides with the GaAs [11-2] orientation.

When the height of the GaN cones attain to a critical level, the feet of the polygonal cones just fill the windows as shown in FIG. 4(2). Then, the GaN polygons extend in the horizontal directions over the mask 11. The GaN grains take a shape of a mesa, as shown in FIG. 4(3). Prevailing slanting planes on the mesas are {11-22} planes 16. The superficial planes 16 which are not parallel with the horizontal plane are called "facets". The facets 16 appear on the mesas, since the GaN polygonal mesas grow in the horizontal directions from the slanting sides of the GaN cones of FIG. 4(2) on the mask 11. During the horizontal growth of the individual mesas, heights of the tops 15 of the individual mesas are a constant. There are gaps between the neighboring, independent GaN mesas. The GaN growth decreases the gaps between the separated GaN mesas. The threading dislocations 14 turn at 90 degrees and expand in the horizontal directions. The GaN mesas grow over the mask 11. Thus, the growing manner of FIG. 4(3) is called "Overgrowth".

The prior art ① and ② reported a conspicuous decline of the density of the penetration dislocations in the extra parts over the mask 11. When a GaN crystal grows along the c-axis [0001], the threading dislocations extend also along the c-axis. When the c-axis growth has ended and the horizontal growth starts, the threading dislocations turn also in the horizontal directions. Thus, ① and ② asserted that the turn of the propagation directions reduces the effective density of the threading dislocations parallel with the c-axis [0001]. The reduction of the dislocations is an advantage of the ELO method.

Soon, the facets 16 of the neighboring mesas collide with each other at the middle lines between the adjacent windows. Further horizontal GaN growth raises the colliding levels of the adjoining mesas and reduces the gaps. Finally, all the gaps and all the {11–22} facets 16 disappear and all the neighboring mesas are unified into a common, flat GaN film crystal 18 as shown in FIG. 4(4). The horizontally extending dislocations collide together at middle planes 17 above the mask. The middle planes 17 store the ends of the threading dislocations. The planes are called "planar defect assemblies" 17. Mirror plane growth is reduced on the C-plane (0001) by the two dimensional growth after disappearance of facets plane. Then, the GaN film 18 begins to grow uniformly upward. Thin threading dislocations start to extend upward again.

① and ② reported that the planar defect assemblies 17 disappear when the film thickness attains to about 140 μm. Since the planar defect assemblies 17 should be buried in the GaN film, the dislocations should be decreased afterward according to ① and ②.

FIG. 5 shows the same growth of the GaN film. FIG. 5(1) is the section of the GaAs substrate 10 covered with the mask 11 having the windows 12, which corresponds to FIG. 4(1). When the GaN epitaxial growth continues for a long time, the GaN crystal grows over the mask 11. Further the GaN crystal is grown upward to a tall GaN single crystal ingot 18 as shown in FIG. 5(2). The direction of the growth is a [0001] orientation (c-axis direction). The top of the GaN ingot is a (0001) plane which is called a "C-plane" The top surface includes flat parts and rough parts. When a sufficiently thick GaN ingot 18 is grown, the GaN ingot is got off from the furnace 1. Then, the GaAs bottom substrate 10 and the mask 11 are eliminated. The GaAs can be removed by aqua regia. When the ingot has a thickness of one wafer, both surfaces or one surface are ground and polished. One C-plane GaN mirror wafer is obtained. When the ingot has a thickness for several times as thick as one wafer, the ingot are sliced into a plurality of GaN wafers 19 and the both surfaces or one surface of each wafer 19 are ground and polished. A plurality of GaN C-plane mirror wafers are obtained. The C-plane wafer is convenient, since the cleavage plane is vertical to the surfaces (C-planes) which facilitates to cut the wafer into a plenty of individual device chips and to form resonator mirrors in LDs.

There is an alternative to the method of FIG. 5 which makes GaN wafers directly from a GaAs substrate wafer.

⑤ Japanese Patent Application No. 10-102546 proposes another method which further grows a GaN single crystal ingot upon a seed GaN wafer 19 obtained by the steps of FIG. 5 by e.g., HVPE method, slices the ingot into a plurality of thin wafers and polishes the wafers. In this method, the seed wafer and the grown wafers have (0001) surfaces.

This new method enables us to produce GaN single crystal wafers on a commercial scale for the first time.

Some defects accompany the GaN wafers produced by the method of FIG. 5. The most serious problem is residuals of threading dislocations on the top surface. When the GaN crystal grows in a mode of maintaining a flat surface (C-plane surface), the threading dislocations accompany upward the growth without disappearing. Then, the top of the GaN wafer is always occupied by the residual threading dislocations.

As alleged by ① and ②, the ELO method succeeds in reducing the dislocations temporarily at an early stage of growth due to bending of the dislocations (FIG. 4(4)). Low dislocation density at the early step is an advantage of the ELO. But the effect is temporary. ① and ② were unaware of the recurrence of dislocations, because they stopped the ELO growth at the step of FIG. 4.(4).

When the GaN crystal is further grown up to a thickness more than several tens of micrometers, threading dislocations turn upward and extend in the c-axis direction, tracing the top surface. The planar defect assemblies 17 vanish at a height of about 140 μm. The disappearance of the planar defect assemblies means to release the dislocations from the highly packed defect assemblies again. The dislocations turn to increase after the extinction of the planar defects. The surface of the GaN crystal is a flat smooth surface. But many dislocations are included in the mirror-like surface.

When the thickness of the GaN crystal reaches several centimeters, the top surface attains to a high density of dislocations of about $1 \times 10^7$ cm$^{-2}$. The dislocation density which has been once reduced by the first bending to the horizontal directions begins to increase by the second bending to the upward direction. The thick GaN ingot has high density dislocations on the top. GaN-LEDs would submit to the high dislocation density GaN wafers as a substrate.

If the GaN wafer were to used for making GaN laser diodes (LDs), the highly populating dislocations, the dislocations would lead the degradation of the GaN films. The rapid degeneration would raise the threshold current and would curtail the lifetime. The ELO-made GaN wafers are not suitable for LDs yet.

The inventors of the present invention have scrutinized the growth modes. In the following description, inclining superficial parts except the (0001) C-plane on the top are called "facet-plane". Thus, the top surface of a growing crystal has C-plane parts and facet-plane parts. In FIG. 4(2) and (3), the slanting side surfaces are all facet-planes 16. As shown in FIG. 4(4), the facet-planes {11–22} of isolated mesas meet with each other and are unified on the mask at a height of about 6 μm. The aggregation decreases the dislocations. Then, the unified flat GaN crystal is further grown in the HVPE apparatus which is controlled to maintain the C-planar mirror top surface. In the meantime the dislocations increase again. GaN film samples of a thickness from 0.2 mm to 0.6 mm are produced by the above-mentioned method (HVPE and ELO). The dislocation density of each sample is measured.

Although the ELO decreases the dislocations, the measured dislocations are higher than $1 \times 10^7$ cm$^{-2}$ at the top surface for the samples. The reason of the recurrence of dislocations is the release of the dislocations once trapped in the planar defect assemblies by an increment of the thickness.

As long as the two dimensional growth which maintains a flat, smooth mirror surface (C-plane) continues, the dislocations extend upward without disappearing, accompanying the vertical growth. The two dimensional growth with the mirror surface contains no mechanism of extinguishing dislocations. Dislocations always climb to catch up to the top surface. If there is no mechanism of killing dislocations, low dislocation density crystal cannot be obtained. The inventors of the present invention thought of a new crystal growth method containing a dislocation annihilation mechanism. If the mechanism of decreasing defects is included in a new growth technique, the technique will enable us to make a low dislocation density GaN single crystal. From the standpoint, the inventors contrived, ⑥ Japanese Patent Application No.11-273882.

This prior invention of the present inventors tried to make a low dislocation density GaN single crystal by maintaining a rough top surface containing facets without burying facets and forming pits containing facets on the top. The facets sweep the dislocations into the pits having facet walls. The pits absorb the dislocations. The dislocations are gathered in the pits. Since the total sum of dislocations is kept constant, the distribution of the dislocations in other portions except the facet pits is reduced.

The invention has an excellent effect of reducing substantially dislocations in a GaN crystal by producing facet structure (roughed surface, facet pits) on the top, guiding dislocations toward the facet pits by the ELO growth and accumulating the dislocations in the pits. The contrivance succeeded in obtaining a low-dislocation density GaN crystal by gathering dislocations into bundles.

Hitherto prior art has been described. General concepts regarding crystallography are described for clarifying the idea of the present invention.

[Identification of Crystallographic Orientations]

Gallium nitride (GaN) belongs to a hexagonal symmetry group. It is rather difficult to identify the crystal orientations. The description of the present invention requires expressions of orientations (directions) and planes of a hexagonal crystal. To avoid confusion for understating of the new idea, the identification of orientations and planes is confirmed. The hexagonal symmetry has three equivalent horizontal axes inclining at 120 degrees to each other and a vertical axis perpendicular to the three. Two axes among the three horizontal axes are called an "a-axis" and a "b-axis". The third axis has no definite name, which is inconvenient. Here, the third horizontal axis is called a "d-axis". The unique vertical axis is called a "c-axis". There are a three index expression and a four index expression. This description employs the four index expression making use of four redundant indices for a-axis, b-axis, d-axis and c-axis. The lengths of the unit a-axis, b-axis and d-axis are equal. The length is denoted by "a". The length of the c-axis is denoted by "c". The ratio a/c depends upon the matters forming hexagonal crystals.

The mirror indices define planes and orientations in an individual manner and a collective manner. In a periodic crystal, a crystallographical plane means a set of an indefinite large number of identical parallel planes. When the plane nearest to the origin cuts the a-, b-, d-, and c-axes at a/h, b/k, d/m and c/n, the plane is expressed by an expression (hkmn), where h, k, m and n are integers (plus, minus or 0) which are called mirror indices. The mirror index is a denominator of the segment. The bracket contains no comma. FIG. 6 shows definitions of h, k and m in the horizontal abd-plane. The a-axis, b-axis and d-axis are half straight lines starting from the origin O. The inclination angles of the axes are 120 degrees. The plane slashes the a-axis (or the negative extension) at a/h, the b-axis (or the negative extension) at b/k and the d-axis (or the negative extension) at d/m. In the example, h and k are positive but m is negative. All three negative indices and all three positive indices are denied.

Different brackets signify different modes of orientations or planes. A round bracket (hkmn) means an individual plane which cuts the a-, b-, d-, and c-axes at a/h, b/k, d/m and c/n. A wavy bracket {hkmn} means a set of collective planes which can be attained by all the allowable crystal hexagonal symmetry operations from the individual (hkmn) plane. A square bracket [hkmn] is an expression of an individual orientation (direction). The [hkmn] orientation (direction) is vertical to the (hkmn) plane. Namely, a plane is always orthogonal to the corresponding orientation having the same mirror indices also in the hexagonal symmetry like other symmetry groups. A key bracket <hkmn> is a collective expression of the orientations which can be attained by all the allowable crystal hexagonal symmetry operations from the individual orientation [hkmn]. Thus, the concrete members contained in the collective expressions {hkmn} and <hkmn> depend upon the object crystal. The hexagonal symmetry itself does not determine the members of the collective expressions.

[hkmn]=individual orientation. <hkmn>=collective orientation.

(hkmn)=individual plane. {hkmn}=collective plane.

If the object crystal has three-fold (rotation) symmetry, the collective expression {hkmn} is the same as {kmhn} and {mhkn} which are obtained by changing the three indices cyclically. If the object crystal has inversion symmetry, the {hkmn} plane is identical to {-h-k-m-n}. Crystallography attaches an upperline to a numeral for signifying a negative number. But since the upperline is forbidden, a front minus sign is used instead of the upperline, for example, -h, -k, -m or -n. The c-axis index "n" should be discriminated from the symmetric h, k and m.

Three mirror indices h, k and m on the horizontal plane are not independent. The freedom is not three but two. The mirror indices h, k and m have a zero-sum rule, $$h+k+m=0. \tag{1}$$

FIG. 7 gives a brief proof of the zero-sum rule. The origin is denoted by "O". Points B and D are allotted onto the b-axis and the d-axis for satisfying OB=OD. Line OH is a negative extension of the a-axis. Point H is the cross point of Line BD with Line OH (-a-axis). <OBH=<ODH=30°. An arbitrary line passing through point H crosses at F and E with OD and OB respectively. Line EHF denotes a crosses segment of an object crystallographical plane with the abd-plane. Lengths are denoted by OE=Y, OF=Z, OH=-X (-X>0). An inclining angle is designated by <DHF=θ. Thus, <OFH=30°-θ, <OEH=30°+θ, <OHF=90°+θ, and <OHE=90°-θ. The sine theorem gives the following relations, $$-X = Y \sin<OEH/\sin<OHE = Y \sin(30°+θ)/\sin(90°-θ)$$

and $$-X = Z \sin<OFH/\sin<OHF = Z \sin(30°-θ)/\sin(90°+θ).$$

$$-X/Y - X/Z = \sin(30° + θ)/\sin(90° - θ) + \sin(30° - θ)/\sin(90° + θ)$$
$$= \{\sin(30° + θ) + \sin(30° - θ)\}/\cos θ$$
$$= 2\sin 30° = 1.$$

Then, $$1/X+1/Y+1/Z=0.$$

The definition of the mirror indices substitute X, Y and Z by X=a/h, Y=b/k and Z=d/m. Three a-, b- and d-axes have the same length (a=b=d). Thus, $$h+k+m=0.$$

The zero-sum rule in the four index expression in the hexagonal crystals is proved.

A plane distance is a distance between the nearest two planes belonging to the same plane group. How is the plane distance denoted in the hexagonal symmetry? For simplicity, the planes (n=0) parallel with the c-axis are first considered. The plane distance of the plane {hkm0} is given by, $$d = \frac{\sqrt{\frac{3}{2}}a}{\sqrt{h^2+k^2+m^2}}. \quad (2)$$

Although h, k and m are essentially two dimensional parameters, the expression resembles the three dimensional case. Modification is contained in the coefficient $(3/2)^{1/2}$.

Two planes which are parallel to the c-axis cross on lines parallel to the c-axis. The crossing angle Θ of two planes (hkm0) and (stu0) is given by $$\cos\Theta = \frac{hs+kt+mu}{\sqrt{h^2+k^2+m^2}\sqrt{s^2+t^2+u^2}}. \quad (3)$$

This formula which holds only on a two dimensional c-plane is superficially similar to the three dimensional crossing angle formula in the cubic symmetry. When two planes parallel with the c-axis are orthogonal to each other, the sum of the products of the indices is zero.

$$hs+kt+mu=0. \quad (4)$$

This is a perpendicular condition.

The planes (000n) having a normal parallel to the c-axis are called "C-plane". "n" means the division number of a unit c-axis. A unit c-axis contains n sheets of the (000n) plane. All planes {hkm0} are perpendicular to the c-planes (000n).

FIG. 8 shows a (1–100) plane and a (11–20) plane. The planes are parallel to the c-axis. The (1–100) plane passes a positive 1 on the a-axis, a negative 1 on the b-axis but would meet with the d-axis at an infinitive distance. Thus, the plane can be denoted by (1–100). The (11–20) plane passes a positive 1 on the a-axis, a positive 1 on the b-axis and a negative half on the d-axis. Therefore, the plane can be denoted by (11–20). The planes satisfy Eq.(4). The (11–20) plane is perpendicular to the (1–100) plane. These two planes have important roles. The {1–100} planes are collectively called "M-planes". The {11–20} planes are collectively called "A-planes". M-plane includes six different planes (1–100), (10–10), (01–10), (–1100), (–1010) and (0–110). These planes can form the sides of a regular hexagon. The neighboring two planes meet with each other at 120 degrees. The individual M-planes incline to each other at 60 degrees, 120 degrees or 180 degrees. A set of only M-planes can structure a regular hexagon.

Similarly A-planes {11–20} include six different individual planes which can form the sides of a regular hexagon. The individual A-planes incline to each other at 60 degrees, 120 degrees or 180 degrees like M-planes. A set of only A-plane can structure a regular hexagon.

Although it is said that the M-plane is at a right angle to the A-plane, all the M-planes do not incline at 90 degrees to all the A-planes. A selected set of, for example, a (1–100) plane and a (11–20) plane satisfies the orthogonality condition. In general, the angles between the M-planes and the A-planes are 30 degrees, 90 degrees, 150 degrees, 210 degrees, 270 degrees or 330 degrees. The basic difference between the A-planes and the M-planes is not 90 degrees but 30 degrees.

Six A-planes and six M-planes can form the sides of a regular dodecagon. The {11–2n} planes are obtained by inclining the A-planes to the c-axis. An assembly of the A-deriving {11–2n} planes can form a regular hexagonal cone. The {1–10} planes are obtained by inclining the M-planes to the c-axis. An assembly of the M-deriving {1–10n} planes can form another regular hexagonal cone. A set of six A-deriving {11–2n} and six M-deriving {1–10n} planes can form a regular dodecagonal cone.

The inventors have succeeded in growing a low-dislocation density GaN single crystal by maintaining rough facet-planes upon the growing surface in accordance with the teaching of ⑥ Japanese Patent Application No.11-273882. This method, however, is subject to accumulation of dislocations at the bottoms of the facet-pits. High dislocation density bundles follow down the facet-pits. Except the bottoms of the facet-pits, the GaN enjoys low-dislocation density.

The GaN of ⑥ has the advantage of having wide regions of low dislocation density except the localized facet-pits with concentrated dislocations. The localized accumulation of dislocations decreases the device properties and the yield. If a GaN crystal is grown under the condition of keeping facets on the top surface along the teaching of ⑥, bundles of dislocations accompany the bottoms of the facet-pits. The regions are degraded by the concentrated dislocations. The LDs fabricated upon the dislocation accumulated regions would be rejected at the inspection, which would decrease the yield. If the LDs are not rejected, the LD's lifetime is shortened. The accumulated dislocations impede the GaN from cleaving by disturbing the regularity of lattices. ⑥ cannot give a final solution because the sum of dislocations is not reduced.

A true solution of the problems should be realized by decreasing penetration dislocations substantially and by removing bundles of dislocations from the surface of the GaN crystal.

Another problem of the GaN crystal having highly accumulated dislocations is disorder of cleavage. Bundles of penetration dislocations locally induce strong stress concentration. When LD devices have been fabricated on a GaN wafer, the wafer will be scribed and cleaved into individual LD chips. Since the GaN is a single crystal, the cleaved plane should be mirror flat. Strong stress concentration, however, prohibits cleaved edges from being flat planes. The cleaved edges of ⑥ show shell-like wavy texture instead of mirror flatness. The wavy texture originates from the ununiformely populating dislocations realized by the facet-maintaining growth. The concentration of dislocations perturbs natural cleavage.

The disorder of cleavage should result from random distribution of inner stress caused by the concentration of dislocations. If the LDs made on a GaN wafer have rough sides caused by the perturbed cleavage, the sides should be polished further for obtaining mirror sides of a resonator. The extra step of polishing would raise the manufacturing cost. High rigidity would require a long time for polishing. If so, the GaN substrate would not be superior to the sapphire substrate at all. Highly expensive GaN would be overwhelmed by inexpensive, accustomed sapphire.

SUMMARY OF THE INVENTION

The solution of the problems requires both the reduction of threading dislocations and the extinction of bundles of dislocations on the surface. Disappearance of the dislocation bundles should expel the disorder of cleavage planes. One purpose of the present invention is to provide a gallium nitride wafer free from localized bundles of dislocations. Another purpose of the present invention is to provide a gallium nitride wafer having clear cleavage. A further purpose of the present invention is to provide a method of making a gallium nitride wafer without bundles of dislocations on the surface. Another purpose of the present invention is to provide a method of making a gallium nitride wafer immune from the disorder of cleavage.

Here, the direction of the crystal growth is denoted by "g". The direction of the extending dislocations is denoted by "q". A first invention is to make a GaN substrate by slicing in a plane S which is parallel to the crystal growing direction g or dislocation extending direction q. Since the slicing plane S is parallel to the dislocation extension direction q, the dislocations run horizontally on the surface of the GaN substrate. Most of the dislocations do not appear on the surface but run in the inner space of the crystal. Then, the dislocation density is reduced on the surface.

The gist of the present invention is to reduce dislocations appearing on the surface by coinciding the dislocations extending directions to the surface. Although the GaN substrate includes a great many dislocations in the depth, a small portion of the dislocations appears on the surface due to the parallelism of the dislocations and the surface. Inner dislocations have no influence upon manufacturing devices (LDs and LEDs). What is important is the dislocations appearing on the surface. The GaN substrate of the present invention which has a small number of dislocations on the surface can be a suitable substrate for producing devices.

The purpose is the reduction of superficial dislocations. The solution is to slice a GaN crystal in a cut plane parallel with the dislocation extension q or growing direction g into a substrate. "g parallel to S" or "q parallel to S" can shortly express the idea of the present invention. A symbol "$\parallel$" denotes parallelism. By the symbol, the present invention is represented by, $$q \parallel S, \quad (5)$$

or $$g \parallel S. \quad (6)$$

"q" and "g" are one dimensional lines. "S" means a two dimensional plane. The surface S is not determined by the restriction of being parallel with q. S still has an extra freedom of rotation by 180 degrees around q. Fortunately, the freedom widens the range of choice of the cutting plane.

The dislocation extension directions sometimes disperse isotropically. The dislocation extending directions are nearly parallel at other times. When the dislocations disperse isotropically, the present invention cannot be applied. Although the dislocation extension directions q are not determined uniquely, the dislocations dispersion has an average direction on the plane. When the dislocation directions diverge but an average direction of the dislocations is defined, the present invention is available.

When the extensions of dislocations can be uniquely defined, Eq.(5) determines the direction of the slicing plane. Thus, irrespective of the growth direction g, a cutting surface S satisfying $q \parallel S$ does exist. The growing direction g determines whether the dislocations disperse or converge. The restriction $q \parallel S$ determines the cutting plane S for the growing direction g having the converging dislocations.

FIG. 9(1) to FIG. 9(4) describe steps of a prior cutting way of a GaN crystal. A GaN crystal ingot is grown ($g \parallel c$) in the c-axis direction on a sapphire or a GaAs substrate. Dislocations extend also in the c-axis direction. Then the prior ingot is sliced in the horizontal plane which is parallel to the growing surface (C-plane). The slicer cuts many dislocations vertically. A Great many dislocations appear on the cut surface, as shown in FIG. 9(3). FIG. 9(4) is a plan view of the prior art substrate having plenty of dotted dislocations. Since the substrate is cut in plane vertical to the dislocations, all the dislocations appear on the surface of the substrate. The prior substrate is suffering from plenty of dislocations. The prior one of FIG. 9(4) is improper to the substrate for making devices.

FIG. 10 shows the slicing of the present invention. An upward arrow designates the growth direction. Thin lines denote dislocations in parallel to the growth direction (g). This invention slices the GaN ingot in a plane parallel to the dislocations ($q \parallel S$). The cutting planes of FIG. 10(1) are vertical to the prior cutting planes of FIG. 9(2). The top surface is the growing plane which is orthogonal to the growing direction. FIG. 10(2) and FIG. 10 (3) show the threading dislocations running in parallel with the surface of the substrate. The density of the dislocations appearing on the surface is greatly reduced by the mode of slicing. Although the total dislocations do not decrease, the superficial dislocations staying on the surface are reduced. The dislocations which have an influence upon producing devices are not the total of the dislocations but the superficial dislocations lying on the surface. Instead of concentrating dislocations into tiny bundles, this invention succeeds in substantially reducing dislocations by laying down dislacations in the horizontal directions. Since the crystal contains no localized bundle of dislocations, the problem of the rugged cleaved planes is also solved by the present invention. FIG. 9(4) and FIG. 10(3) clarify the difference between prior art ⑥ and the present invention.

If the growing direction coincides with the dislocation extension (g=q), the present invention obtains another expression that the slicing plane S should be parallel to the growth direction ($g \parallel S$). Eq.(6) denotes the same condition. In such a case (g=q), FIG. 10(1) exhibits the cutting plane S being parallel to the growth direction g. The present invention includes the case of $S \parallel g$. If g=q, $q \parallel S$ is equivalent to $g \parallel S$.

Someone may think that if $q \parallel S$ is equivalent to $g \parallel S$, one should be omitted in the expression for avoiding redundancy. But if two conditions are equivalent, elimination of one is undesirable. When a single crystal is grown by some method, the growing direction g is obvious. The direction g is perpendicular to the substrate. On the contrary, the extensions of threading dislocations are not easily confirmed. The dislocations are detected by slicing the ingot into sheet crystals, etching the sheet crystals by a special etchant revealing dislocations and observing the appearing dislocations. The definition through the dislocation extensions incurs a difficulty of determining dislocation extensions. It is more convenient to define the present invention by the growing direction "g".

This invention can be applied even when the growing direction deviates from the dislocation extensions ($g \neq q$). In case of $g \neq q$, $q \parallel S$ has priority over $g \parallel S$.

The concept "reduction" of dislocations is now clarified, since the purpose of the present invention is to make low-dislocation density GaN substrates. The change of cutting planes from the conventional orthogonal planes to parallel planes to the growing direction does not decrease the inherently-lying dislocations. The intrinsic dislocations survive in the crystal despite the cutting planes. The sum of dislocations is intact after the cutting. What makes an influence upon the device performance is not the deep (intrinsic) dislocations hidden in the bulk but the superficial dislocations appearing on the surface. The present invention aims not at reducing all the dislocations in the bulk but at reducing only the dislocations appearing on the surface. The word "reduction" signifies the reduction of the superficial dislocations in the present invention. "Low-dislocation density" means that the dislocations appearing on the surface is of low density.

Fortunately, the horizontally running dislocations do not perturb the cleavage property, since the dislocation extensions are parallel to the surface of the substrate.

The problem of the density of threading dislocations is simple. The dislocation density on a surface orthogonal to the dislocation extension is denoted by "E". E is the number of dislocations included in a unit area which is perpendicular to the dislocations. The number of dislocations which pass a unit area which slants at an inclination angle $\phi$ to the dislocations is in proportion to $\cos\phi$. $E\cos\phi$ is the dislocation density on the slanting plane inclining at $\phi$ to the dislocation direction. The gist of the present invention is to slice the GaN ingot in planes which are parallel to the extension of the threading dislocations. Namely, the invention realizes $\phi=90$ degrees which gives $\cos\phi=0$. $\cos\phi=0$ means the reduction of dislocations on the surface of the substrate in the present invention. Geometric consideration clarifies the low density of dislocations on the surface of the substrate which is obtained by slicing in the cutting plane which is parallel to the dislocation extension.

Deliberate experiments enabled the inventors to discover a fortunate property that favorable p-q equivalence (q=g) holds on three special growing orientations. The growing direction "g" is equal to the dislocation extension "q" in the three growing orientations. The discovered special growing orientations are <1–100>, <11–20> and <0001>. For convenience, symbols m, a and c are allotted to the selected growing directions, i.e., m=<1–100>, a=<11–20> and c=<0001>. The p-q equivalence (q=g) is a very useful property. Other growing directions are not favored with the p-q equivalence. When a GaN crystal is grown in the other directions, dislocations extensions deviate from the growing directions. The planes orthogonal to the selected growing directions m, a and c are designated by $$M=\{1-100\}, A=\{11-20\} \text{ and } C=\{0001\}. \tag{7}$$

The growing directions m, a and c are orthogonal to the planes M, A and C respectively. When a GaN crystal is grown in m-, a- or c-directions, the p-q equivalence (q=g) allows the present invention to determine suitable slicing planes S which are parallel to the growing direction g.

Fortunately, the special planes can be orthogonal to each other by selecting proper sets of M, A and C-planes. The orthogonality among three special planes is another favorable property which provides this invention with practical utility. Since GaN is hexagonal on the normal condition, there are six equivalent planes which can be transformed by the allowed symmetry operations. The M-plane includes six equivalent planes and A-plane also contains six equivalent planes. The C-plane includes two planes. All C-planes are orthogonal to all A-planes. All C-planes are orthogonal to all M-planes. An arbitrary member of the A-planes is orthogonal to two of the M-planes. An arbitrary member of the M-planes is orthogonal to two of the A-planes. FIG. 11 shows a cubic consisting of an A-plane (11–20), an M-plane (1–100) and a C-plane (0001) which are orthogonal to each other. Hexagonal symmetry has a surprising property of the orthogonality of three low mirror index planes. The present invention makes the best use of the orthogonal property.

There may be another growing direction ensuring the p-q equivalence than the m, a and c-directions. If so, the present invention can be applied to the direction.

All the probable directions do not have equal tendency of making a single crystal. Some directions are more suitable but other directions are less suitable for growing single crystals in their directions. Favorably, the three low index orientations are all easy growth directions. At present, neither A-plane GaN crystal nor M-plane GaN crystal is available yet. Few C-plane GaN single crystals have been made due to immature technology. However, the inventors have confirmed the easy growth of the three orientations. Namely, m, a and c can be chosen as a growing direction g.

$$g=m, a, c \tag{8}$$

On the contrary, the surfaces of the GaN crystals are determined by the requests of device makers. Since the GaN crystal is the substrate wafer for producing devices, low index substrates of M-substrates, A-substrates and C-substrates will be required in the main.

Cleavage planes of GaN are a C-plane (0001) and an M-plane {1–100}. The existence of cleavage is one of the strong point of GaN. If GaN LDs are fabricated upon an A-plane substrate (A-substrate in short), natural cleavage can form parallel mirrors of two sides (M-planes or C-planes) of an LD chip as a resonator. If GaN LDs are fabricated upon an M-plane substrate (M-substrate in short), natural cleavage can form parallel mirrors of two sides (C-planes) of an LD chip as a resonator. However, there is neither A-substrate nor M-substrate of a practical size. If GaN LDs are fabricated upon a C-plane substrate (C-substrate in short), natural cleavage can form parallel mirrors of two sides (M-planes) of an LD chip as a resonator. Preferable slicing planes S are, $$S=M, A, C. \tag{9}$$

FIG. 12 demonstrates the concept of the present invention that low-dislocation GaN substrates are obtained by slicing a GaN crystal ingot in planes "S" parallel to the growing direction "g". "S" denotes a cutting plane, "g" is a growing direction. Growth surface on the front is orthogonal to the growing direction g. The cutting planes S are orthogonal to the growth surface. The orthogonality of the growing surface to the slicing planes is equivalent to the parallelism of the growing direction g to the cutting surface S(g∥S). Both are directed to the same idea of the present invention. The m-growing direction requires C-cutting planes or A-cutting planes. The a-growing direction requires M-cutting planes or C-cutting planes. The basic condition g∥S can alternatively be expressed by a rule that a GaN ingot should be cut along the growing direction g.

The above described single step compensation of the growth and slice is a basic concept of the present invention. A heavier significance lies on reduction of dislocations based upon multiple growths. The multiple growths mean repetitions of slicing a GaN ingot along dislocations into seeds and growing a GaN ingot on the GaN seed. A single cycle of growth and slice produces a low-dislocation seed having few dislocations on the surface as shown in FIG.

10(2). If another GaN ingot is grown on the low-dislocations density seed of FIG. 10 (2), the GaN ingot would enjoy low-dislocation density, since dislocations in the growing crystal succeed the intrinsic dislocations on the surface of the seed.

A low dislocation density seed allows this invention to produce a GaN crystal of a dislocation density as low as the seed. The parallel slicing denoted by q=S or g=S decreases the dislocation density further. Namely, a change of the growth directions at 90 degrees in double growths enables the present invention to reduce dislocations. The reduction of dislocations is not superficial but substantial. True reduction of dislocations is accomplished by multiple growths which vary the growing directions g. The reduction of dislocations by the zigzag repetitions of growth and slice is another strong point of the present invention. As shown in FIG. 12, a second growth in the w-direction brings about a true decline of dislocations.

In addition to double growth, this invention is realized by higher times of zigzag growths, for example, zigzag triplet growths, zigzag quadruple growths or so. Three different growing directions m, a and c enable multiple growths to accomplish a variety of sets of planes and orientations.

Motives for which the inventors hit this invention are described. The inventors were aware that the dislocations have a tendency of extending in the same direction as the growth in a GaN growth, for example, in GaN film growth on sapphire substrates which are still prevalent to make blue-light GaN/sapphire LEDs. Enormous dislocations extending in a c-direction are observed in the GaN film growing in the c-direction on the sapphire.

From the observation, the inventors hit an idea for the reduction of dislocations by coinciding a surface with dislocations through slicing a GaN crystal in the planes which are parallel to the growing direction. The fundamental idea of the invention is to reduce dislocations by making a GaN crystal having dislocations aligning in a direction, slicing the GaN crystal in the dislocation-aligning plane and obtaining low-density dislocation GaN. This is entirely a novel idea. Who has noticed the way of slicing a crystal in the direction parallel to the growth? Nobody was aware of the growth-parallel-slicing of a crystal.

BRIEF DESCRIPTION OF THE DRAWINGS

FIG. 4(2) is a section of the masked (111) GaAs substrate at an early growing step of the ELO method at which gallium nitride isolated crystal cones grow on the revealed portions of the GaAs substrate within the windows with dislocations extending upward.

FIG. 4(3) is a section of the masked (111) GaAs substrate and GaN crystals at an intermediate growing step of the ELO method at which gallium nitride isolated crystal cones grow in horizontal directions out of the windows and expand over the mask with dislocations extending outward in the horizontal directions.

FIG. 4(4) is a section of the masked (111) GaAs substrate and GaN crystals at a uniform growing step of the ELO method at which gallium nitride isolated crystal cones meet each other, form a unified mirror surface and begin to grow in the vertical direction with dislocations accumulating into planar dislocation assemblies at the middle of the neighboring windows.

FIG. 5(2) is a section of the GaAs substrate, the mask and a GaN crystal at a final step of the ELO method at which the unified tall GaN crystal grows over the mask on the GaAs substrate.

FIG. 5(3) is a section of sliced GaN substrates obtained by cutting the tall GaN ingot in planes vertical to the growing direction (parallel with the bottom surface).

FIG. 9(2) is a perspective view of an ingot sliced into several sheets of crystal according to the prior manner which cuts orthogonally the threading dislocations by taking cutting planes parallel to the bottom of the ingot.

FIG. 9(3) is a perspective view of the prior manner sliced sheet crystal in which all of the dislocations appear as a dot on the surface.

FIG. 9(4) is a plan view of the prior manner sliced sheet crystal in which all of the dislocations appear as a dot on the surface.

FIG. 10(2) is a perspective view of the sheet crystal sliced by the invention in which a few of the dislocations appear as a line on the surface and almost all of the dislocations are hidden within the crystal.

FIG. 10(3) is a plan view of the sheet crystal sliced by this invention in which a few of the dislocations appear as a line on the surface.

FIG. 19 is three diagrams showing the variations of the directions in the crystal growth and the substrate slicing in Embodiment 1.

FIG. 20 is two diagrams showing the variations of the directions in the crystal growth and the substrate slicing in Embodiment 2.

FIG. 21 is two diagrams showing the variations of the directions in the crystal growth and the substrate slicing in Embodiment 3.

FIG. 22 is three diagrams showing the variations of the directions in the crystal growth and the substrate slicing in Embodiment 4.

FIG. 23 is three diagrams showing the variations of the directions in the crystal growth and the substrate slicing in Embodiment 5.

DETAILED DESCRIPTION OF THE PREFERRED EMBODIMENTS

Figure 1:
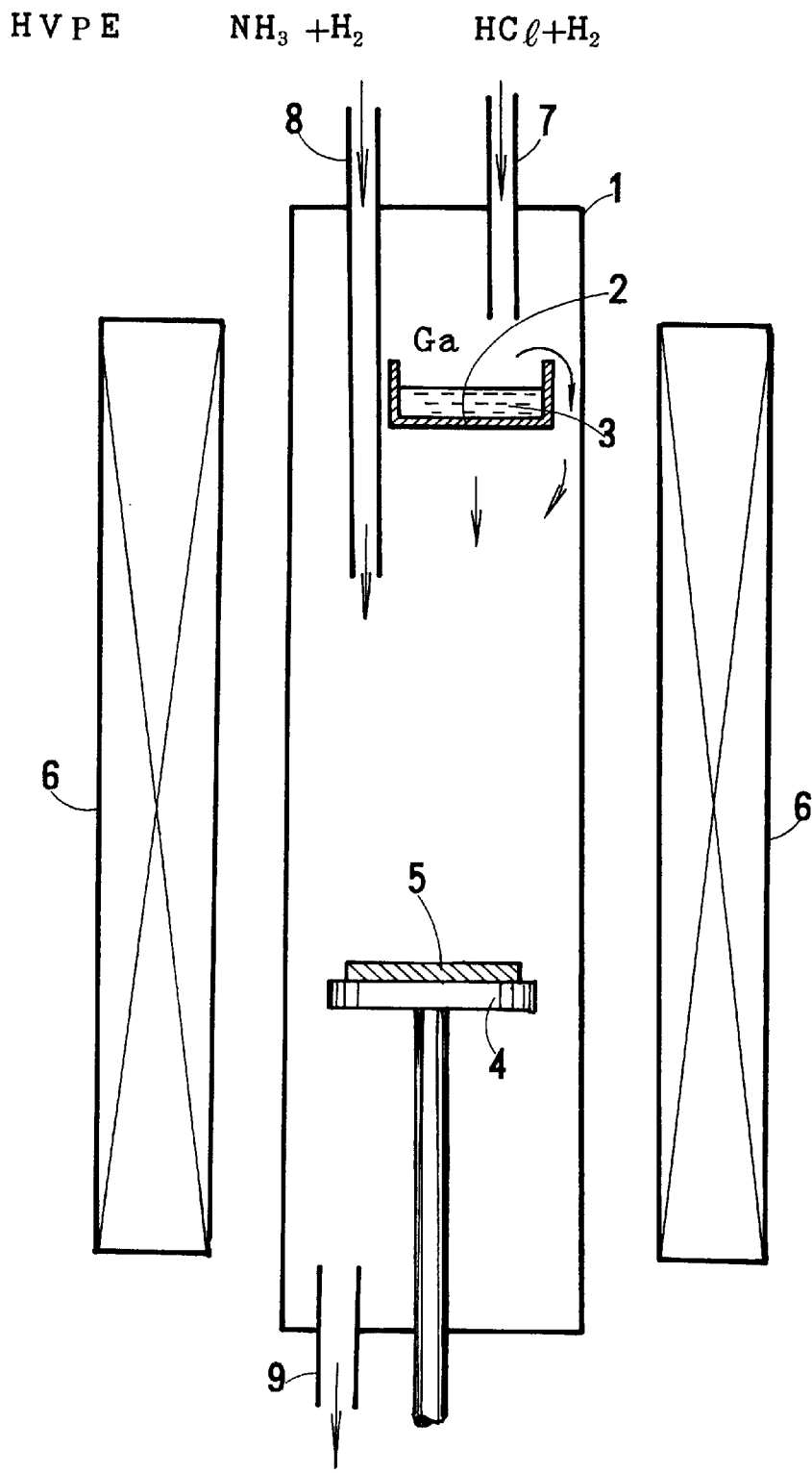
FIG. 1 is a schematic section of a HVPE (hydride vapor phase epitaxy) apparatus for making a GaN film crystal on a substrate by reactions $2HCl+2Ga \rightarrow 2GaCl+H_2$ and $GaCl+NH_3 \rightarrow GaN+H_2+HCl$.

This invention can be applied to GaN vapor phase growing methods, for example, an HVPE method, an MOCVD method and a sublimation method. This invention, which makes the best use of the dislocations extending in parallel to the growing direction, can also be applied to other GaN growing methods, e.g., an ultrahighpressure GaN growing method than the vapor phase growths.

The basic concept of the present invention is to reduce superficial dislocations of a GaN single crystal substrate by slicing a GaN single crystal ingot in planes parallel to either the growing direction g or the dislocation extending direction q (claims 1–4, claims 21–22).

The investigation of the inventors has revealed the following relations between crystal growing directions and dislocation extending directions.

Three kinds of GaN seeds are prepared by slicing GaN single crystal ingots in different planes. A first seed has a (0001) surface. A second seed has a (1-100) surface. A third seed has a (11-20) surface. Typical planes have special nicknames in the GaN crystal structure. (0001) is called a C-plane. (1-100) is called an M-plane. (11-20) is called an A-plane. The nicknames are commonly used for individual planes and collective planes. The c-direction growth is otherwise called a C-plane growth.

GaN crystals are grown on the three GaN seeds on the condition of maintaining mirror flat surfaces parallel to the seeds. The relation between the growing direction and the dislocation extending direction is scrutinized by a TEM (transmission electron microscope) observation. The inventors found the following relations, (1) <0001> growing direction (C)→<0001> dislocation extending direction, (2) <1-100> growing direction (M)→<1-100> dislocation extending direction, (3) <11-20> growing direction (A)→<11-20> dislocation extending direction.

The result means that in the cases of the C-, M- and A-plane growths, the dislocation extending direction (q) are nearly equal to the growing directions (g). The rule is called "p-q equivalence". The p-q equivalence is valid only in the M-, A- and C-plane growths.

The present invention takes advantage of the p-q equivalence (p=q) for reducing the dislocation density on GaN substrates. A (11-20) plane growth has a tendency of inviting facets which makes a rugged surface. A suitable condition enables the (11-20) plane growth to maintain a mirror flat surface.

The p-q equivalence is not valid for other plane growths. The dislocation extending directions deviate from the crystal growing direction. For example, an R-plane (1-101) growth and an F-plane (11-22) growth lack such a rule.

(4) <1-101> growing direction (R)→<1-100> dislocation extending direction, (5) <11-22> growing direction (F)→<11-20> dislocation extending direction.

For these directions, the dislocation direction q does not coincide with the growth direction g (g≠q). Such a direction does not reject this invention. This invention is also applicable to the cases. In the case of discrepancy (g≠q), this invention adopts q (dislocation direction). The dislocation direction q has priority over the growth direction g. Slicing the R-plane or F-plane growth single crystal ingots in planes parallel with q decreases the superficial dislocations. The multiple growths can be also applied to the F- and R-plane growths. The substrates obtained by slicing the R- or F-growth ingot in q-parallel planes are reduced to either an M-surface substrate or an A-surface substrate.

This invention obtains low-dislocation density GaN substrates by growing a GaN single crystal ingot on a C-, M- or A-surface seed in the c-, m- or a- growing direction respectively, slicing the GaN ingot in planes which are parallel to the dislocation directions q which satisfies q=g.

In the cases of a single growth, (1), (2) and (3) provide low dislocation density GaN single crystals by growing a GaN single crystal ingot in a g direction (g=m, a or c), slicing the GaN ingot in planes S (S=A, M, C) parallel to q=g and obtaining GaN substrate crystal with low dislocation density.

This invention is applicable to multiple growths which have far more effect for reducing dislocations. A second growth makes a thick GaN crystal on a C-, M- or A-surface GaN seed which is obtained by slicing a GaN ingot in planes parallel to the growth direction. Then, the GaN is sliced along the dislocations. Repetitions of the growth and the parallel-dislocation slice decrease substantially the dislocations by prohibiting the dislocations from succeeding.

This invention is inherently complicated. Many probable sets of successive growing directions increase the difficulty of intuitive understanding. Symbolic representation is introduced for facilitating to understand various embodiments.

In the case of a thin substrate, the surface orientation is denoted by a capital letter of alphabet. The growing direction is designated by a small letter of alphabet. The growing direction is a dynamical expression. The growing direction is transcribed to the grown ingot. Namely the substrate is symbolically denoted by a capital letter and the ingot (growth) is denoted by a small letter. In short, substrate= capital letter, but ingot=small letter. The time flow proceeds from the left to the right. For example, "Xx" means a step of growing a thick GaN crystal in an x-direction upon an X-surface GaN seed or an ingot made by a step of growing a thick GaN crystal in an x-direction upon an X-surface GaN seed.

Epitaxial growth equalizes the growing direction to the seed crystal orientation, e.g., Xx, Yy or Zz. Epitaxy forbids different letters making a pair. Xy, Yz, Zx and so on are forbidden.

The slicing step is denoted by a semicolon ";". The slicing plane is denoted by a capital letter following the semicolon. For example, "Xx;Y" briefly signifies a step of growing a thick GaN crystal ingot in an x-direction upon an X-surface GaN seed, slicing the ingot in Y-planes and obtaining a Y-surface substrate or a substrate made by the same step. The repetition of operations can be simply represented by a product of elementary operations.

"Xx;Yy" signifies a step of growing a thick GaN crystal ingot in an x-direction upon an X-surface GaN seed, slicing the ingot in Y-planes, obtaining a Y-surface substrate and growing another thick GaN crystal in a y-direction upon the Y-surface substrate or an ingot made by the same step.

"Xx;Yy;Z" signifies a step of growing a thick GaN crystal ingot in an x-direction upon an X-surface GaN seed, slicing the ingot in Y-planes, obtaining a Y-surface substrate, growing another thick GaN crystal in a y-direction upon the Y-surface substrate seed, slicing the ingot in Z-planes and obtaining a Z-surface substrate or a substrate made by the same step.

"Xx;Yy;Zz" signifies a step of growing a thick GaN crystal ingot in an x-direction upon an X-surface GaN seed, slicing the ingot in Y-planes, obtaining a Y-surface substrate, growing another thick GaN crystal in a y-direction upon the Y-surface substrate seed, slicing the ingot in Z-planes, obtaining a Z-surface substrate and growing a further thick GaN crystal in a z-direction upon the Z-surface substrate seed or an ingot made by the same step or a substrate made by the same step.

The use of the symbols facilitates to represent and understand complex process containing multiple growths. "Cc;C" is an expression for an ordinary, commonplace prior-considered (but unaccomplished) method of C-surface GaN single crystal substrates by growing a C-GaN thick crystal ingot in a c-direction upon a C-surface GaN seed, slicing the C-GaN ingot in C-planes into C-surface thin substrates. This "Cc;C" which would be the most popularly-thought prior art has not been realized in practice due to the lack of a wide C-GaN substrate yet. However, "Cc;C" is now imagined as a prior art method which gives a standard of techniques from which the advantages of the invention should be considered. Since the capital letter after the semicolon is the same as the small letter before the semicolon (c;C), no reduction of dislocation occurs. Since dislocations contained in the ingot survives on the substrates sliced from the ingot. Thus, "c;C" is a main object which this invention denies.

Unlike the imagined prior art, this invention succeeds in obtaining an effect of reducing dislocations superficially and substantially by slicing an ingot GaN crystal in planes which are parallel to the dislocation running direction, which gives a different capital letter after ";" from the small letter before ";".

In contrast to the imagined prior art, the gist of the present invention is simply expressed by our contrived symbol as, $$x;Y\ (x \neq y). \tag{10}$$

This is a brief but decisive expression of the present invention. The symbol means that the growing surface (X) is different from the slicing plane (Y). The discrepancy between the growing surface and the slicing plane enables this invention to reduce the dislocation density on a surface of the sliced substrate. "x;X" is the prior art. "x;Y" is the present invention. There is a clear difference.

The basic idea is simple. But there are many sets of assemblies of the growing surfaces and the slicing surfaces which can realize this invention, because many crystallographic planes exist in a GaN single crystal. An increase of the times of growth enhances the number of available sets.

To avoid too complicated description, the following description is restricted within mutual conversions among the three typical planes M, A and C. Capital letters M, A and C designate a plane, a plane orientation or a substrate having the plane which have a two-dimension character. Small letters m, a and c designate a growing direction, a growth of the direction or an ingot grown in the direction which have a one-dimension character. Graphical expression will be introduced for favoring intuitive understanding and complementing still fragile symbolic representation.

Figure 13:
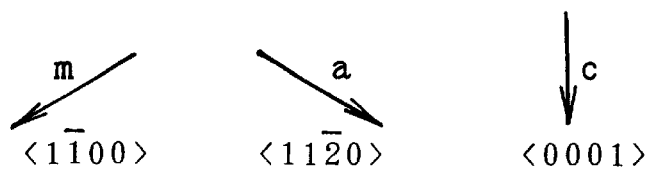
FIG. 13 is a figure of defining three kinds of arrows showing growing directions for symbolically clarifying the present invention aiming at decreasing superficial dislocations by varying the growing directions. A left-down m-arrow means a <1-100> growing direction. A right-down a-arrow means a <11-20> growing direction. A straight-down c-arrow means a <0001> growing direction.

FIG. 13 denotes a rule of representing three growing directions by three downward arrows. The downward arrows correspond with the passing of time. A left-downward arrow is promised to denote an m=<1–100> direction. A right-downward arrow is promised to denote an a=<11–20> direction. A plumb-downward arrow is promised to denote a c=<0001> direction. The arrow shows a growing operation and a time flow. Multiple growths are represented by a series of continual downward arrows. The assemblies of arrows showing serial changes of growing directions are now named a "crystal growth diagram". FIG. 14 to FIG. 18 show main crystal growth diagrams signifying varieties of orientation conversions allowed by the present invention.

[Single Step Process]

Figure 14:
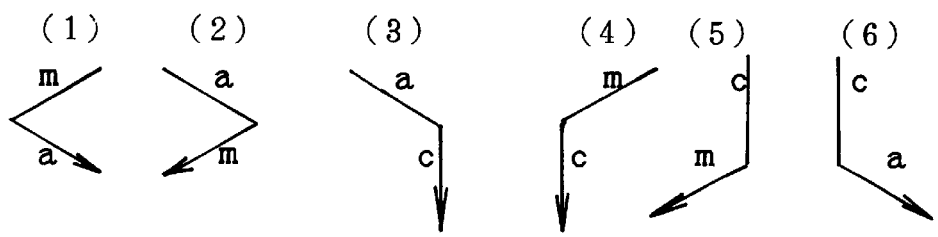
FIG. 14 is six diagrams showing all the possible sets of the substrate orientations and the growing directions which are available in a single step growth in compliance with the teaching of the present invention aiming at reducing dislocations by varying the growing directions or the slicing directions.

The simplest examples are called a "single step process" which makes GaN substrates by a single growth and a single slice. The single step process contains only six cases (3×2). FIG. 14 shows six diagrams of the single step process. A diagram is an individual expression of a mode. A mode corresponds to a diagram. All the diagrams will be attached with serial numbers.
[Diagrams of Single Step Process(FIG. 14)]

$$(1) \text{ m;A } (2) \text{ a;M } (3) \text{ a;C } (4) \text{ m;C } (5) \text{ c;M } (6) \text{ c;A.} \quad (11)$$

The effect of reducing dislocations is briefly denoted by the different characters before and after the semicolon ";". These six diagrams (modes) (1) to (6) are fundamentals of the present invention. What the present invention refuses is "a;A", "m;M" and "c;C". The modes "a;A" and "m;M" are still unrealistic. The mode "c;C" which has not been manufactured yet is deemed as an imaginary prior art in the description.

For example, diagram (1) Mm;A means a series of steps of preparing an M-surface {1–100} GaN seed, growing an M-surface {1–100} GaN ingot on the M-seed in an m-direction, slicing the M-ingot in A-planes {11–20} and obtaining A-surface GaN substrates. Among the six modes, sets including a C are important for the sake of facile production. Namely promising sets are the following four,
[Four Important Diagrams of Single Step Process]

$$(6) \text{ c;A } (5) \text{ c;M } (4) \text{ m;C } (3) \text{ a;C.} \quad (12)$$

In the description of embodiments, (6)c;A, (5)c;M, (4)m;C and (3)a;C will be called (6)CA-type, (5)CM-type, (4)MC-type and (3)AC-type. Extra (1)m;A and (2)a;M are entirely novel and interesting sets. But difficulty of producing (1) and (2) forces us to omit a further description of (1) and (2).
[Double Step Process ]

Figure 15:
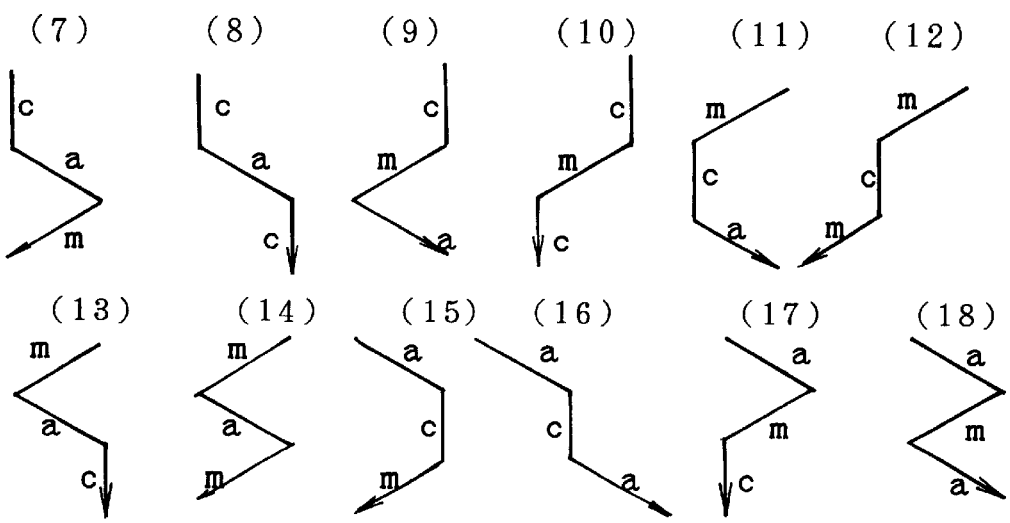
FIG. 15 is twelve diagrams showing all the possible sets of the substrate orientations and the growing directions which are available in a double step growth in compliance with the teaching of the present invention aiming at reducing dislocations by varying the growing directions or the slicing directions.

Double step process is one of the multiple growth processes next to the single process of FIG. 14. Since the single step process includes six diagrams, the double step process includes 12 diagrams (6×2=12). FIG. 15 shows 12 diagrams belonging to the double step process.
[Diagrams of Double Step Process (FIG. 15)]

$$\begin{aligned}&(7)\text{c;Aa;M } (8)\text{c;Aa;C } (9)\text{c;Mm;A } (10)\text{c;Mm;C } (11)\text{m;Cc;A}\\&(12)\text{m;Cc;M } (13)\text{m;Aa;C } (14)\text{m;Aa;M } (15)\text{a;Cc;M } (16)\text{a;Cc;A}\\&(17)\text{a;Mm;C } (18)\text{a;Mm;A.} \quad (13)\end{aligned}$$

The twelve diagrams denote all the examples of the double step process accomplishing the present invention. The capital letter and the following small letter sandwiched by two semicolons ; and ; are always same, e.g., ;Mm;, ;Cc; and ;Aa;, because homoepitaxy equalizes the orientation of the GaN ingot to the orientation of the GaN seed. In the diagrams, intermediate processes ;Mm;, ;Cc; and ;Aa; are simplified to arrows m, c and a. All the twelve diagrams have an effect of two chances of reducing dislocations. In practice, since GaN crystals will be grown mainly in the c-direction, significant diagrams in the twelve are four diagrams (7), (8), (9) and (10) including a c-growth at an initial process or at a final process.
[Significant Four Diagrams in Double Step Process]

$$(7)\text{c;Aa;M } (8)\text{c;Aa;C } (9)\text{c;Mm;A } (10)\text{c;Mm;C.} \quad (14)$$

Device makers will request C-surface GaN substrates, because the C-surface substrates are practically convenient. Among the four, the most significant ones are two diagrams (8) and (10).
[Most Significant Two Diagrams in Double Step Process]

$$(8)\text{c;Aa;C } (10)\text{c;Mm;C.} \quad (15)$$

Figure 16:
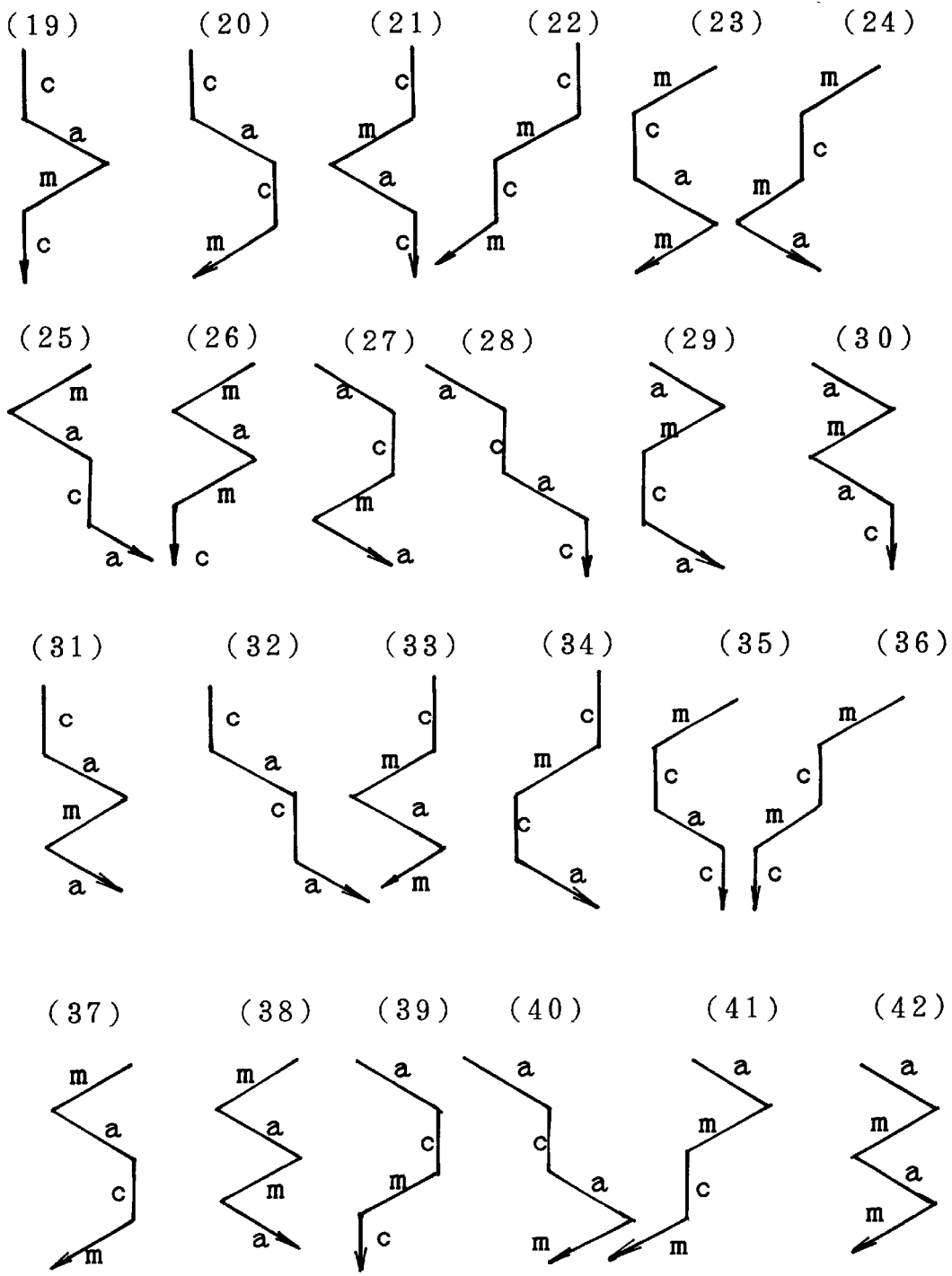
FIG. 16 is twenty-four diagrams showing all the possible sets of the substrate orientations and the growing directions which are available in a triple step growth in compliance with the teaching of the present invention aiming at reducing dislocations by varying the growing directions or the slicing directions.
Figure 17:
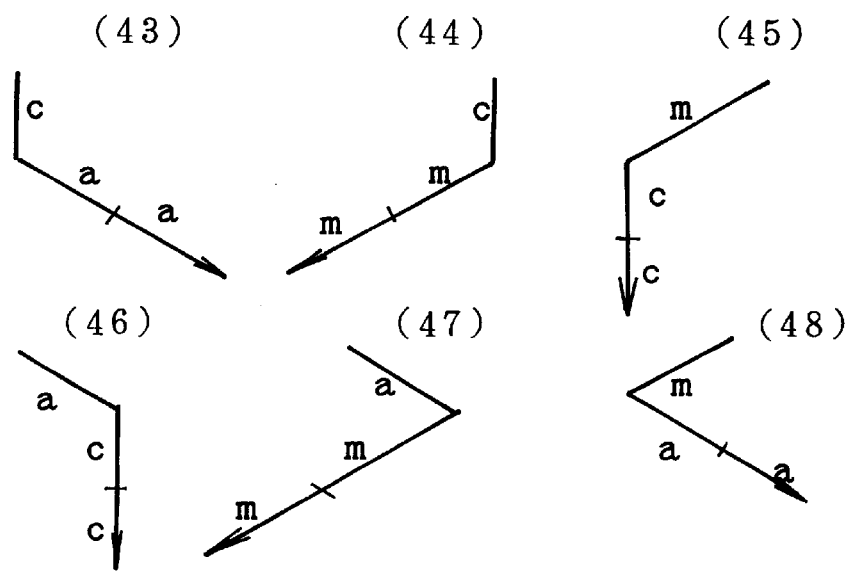
FIG. 17 is six diagrams showing all the possible sets of the substrate orientations and the growing directions which are available in a double step growth designed on condition that the first step changes the growing directions and the second step maintains the same growing direction as the first step.
Figure 18:
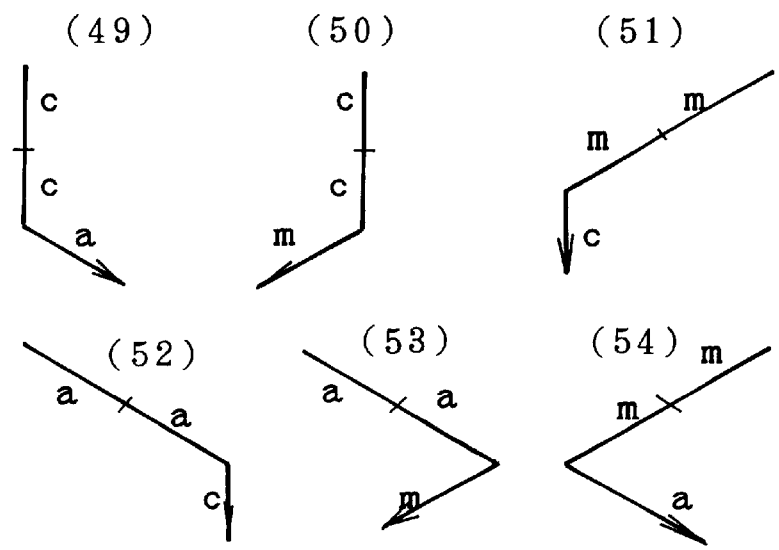
FIG. 18 is six diagrams showing all the possible sets of the substrate orientations and the growing directions which are available in a double step growth designed on condition that the first step maintains the growing directions and the second step varies the growing direction.

[Triple Step Process]
Triple step process is a higher order one of the multiple growth process next to the double step process. Since the double step process includes twelve diagrams, the triple step process includes 24 diagrams (12×2=24). FIG. 16 shows 24 diagrams belonging to the triple step process.
[Diagrams of Triple Step Process (FIG. 16)]

Quadruple step process has 48 diagrams including three times of slicing available for reduction of dislocations. The diagrams can be obtained from the triple step process. Thus, the description of the higher orders is omitted. The diagrams (1) to (42) are all pure processes including the slice along dislocations for pursuing the idea of the present invention with fidelity.
[Hybrid Processes Including an x;X Slicing]

Higher order growth process allows this invention to have other processes including fewer times of reducing dislocations than the pure processes. When one dislocation-along slicing has an enough function of reducing dislocations, the double step process or the triple step process allows extra diagrams including x;X type pairing of c;C, a;A and m;M which mean the GaN is once cut in an ordinary slicing plane orthogonal to the extension of dislocations. The extra modes are named hybrid process in contrast to the pure process.

Thus, the double step process of the present invention includes 3×3×3–3=24 modes. The pure double step process includes twelve modes showing in FIG. 15. The double step process contains twelve hybrid modes including x;X type slicing. The triple step process contains 3×3×3×3–3=78 modes. Pure triple step process has 24 modes in FIG. 16. The triple step process contains fifty-four hybrid modes including x;X type slicing.

Hybrid modes of the double step process are described. The hybrid modes which contain the x;X slicing at the latter step are six modes of,
[Double Step Hybrid Modes ( . . . ; . . . x;X) (FIG. 17)]

$$\begin{aligned}&(43)\text{c;Aa;A } (44)\text{c;Mm;M } (45)\text{m;Cc;C } (46)\text{a;Cc;C } (47)\text{a;Mm;M}\\&(48)\text{m;Aa;A.} \quad (17)\end{aligned}$$

The hybrid modes which contain the x;X slicing at the earlier step are six modes of,
[Double Step Hybrid Modes (x;X . . . ; . . . )(FIG. 18)]

$$\begin{aligned}&(49)\text{c;Cc;A } (50)\text{c;Cc;M } (51)\text{m;Mm;C } (52)\text{a;Aa;C } (53)\text{a;Aa;M}\\&(54)\text{m;Mm;A.} \quad (18)\end{aligned}$$

In the hybrid modes, the c-growth starting from the C-substrate is important in practice. Four modes (43), (44), (49) and (50) are more important. Thus, significant modes are the following six modes which are a sum of Eq.(15) of the pure modes and the four hybrid modes in Eq.(18).
[Double Step Process Starting from C-surface Substrates]

$$\begin{aligned}&(8)\text{c;Aa;C } (10)\text{c;Mm;C } (43)\text{c;Aa;A } (44)\text{c;Mm;M } (49)\text{c;Cc;A}\\&(50)\text{c;Cc;M.} \quad (19)\end{aligned}$$

Modes (8) and (10) have two chances of dislocation reduction. Modes (43), (44), (49) and (50) have single chance of reducing dislocations. Till now, all the modes realizing this invention in the single-, double- and triple-step processes have been described by both symbols and diagrams. [Classification of claims based upon diagram representation]

Claims define the present invention. Since the number of claims is large, it is not easy to understand the mutual relations among the claims. Classification of the claims in terms of the symbolic representation facilitates to understand the significance of each claim. The left column shows claim numbers. The right terms designate the corresponding modes which have been numbered in FIG. 14 to FIG. 18.

[Claim-diagram Correspondence]
claims 1–4=(1)m;A (2)a;M (3)a;C (4)m;C (5)c;M (6)c;A
claim 5=(4)m;C
claim 6=(3)a;C
claim 7=(4)Mm;C
claim 8(←7)=(10)c;Mm:C(58)
claim 9(←7)=(51)m;Mm;C
claim 10=(3)Aa;C
claim 11(←10)=(8)c;Aa;C
claim 12(←10)=(52)a;Aa;C
claim 13=(5)c;M
claim 14=(5)Cc;M
claim 15(←14)=(15)Aa;Cc;M (12)Mm;Cc;M
claim 16(←14)=(50)Cc;Cc;M
claim 17=(6)c;A
claim 18=(6)Cc;A
claim 19(←18)=(16)Aa;Cc;A (11)Mm;Cc;A
claim 20(←18)=(49)Cc;Cc;A
claims 21–26=(1)m;A (2)a;M (3)a;C (4)m;C (5)c;M (6)c;A
claims 27, 28=(4)m;C
claims 29, 30=(3)a;C
claims 31, 32=(5)c;M
claims 33, 34=(6)c;A
claim 37=(43)c;Aa;A (47)a;Mm;M (45)m;Cc;C (44)c;Mm;M (48)m;Aa;A (46)a;Cc;C
claim 38=(43)c;Aa;A (47)a;Mm;M (45)m;Cc;C (44)c;Mm;M (48)m;Aa;A (46)a;Cc;C
claim 39=(45)m;Cc;C
claim 40=(46)a;Cc;C
claim 41=(44)c;Mm;M claims 23 and 24 declare the dislocations running in the bulk in parallel to the surface of the GaN substrate. The surface-parallel dislocations reduce the number of the dislocations appearing on the surface. The general description denotes the six modes of c;M, m;A, a;C, c;A, a;M and m;C.

claims 25 and 26 declare the dislocations running in the bulk mainly in a direction parallel to the surface of the GaN substrate. The surface-parallel dislocations reduce the number of the dislocations appearing on the surface. The description also denotes the six modes of c;M, m;A, a;C, c;A, a;M and m;C.

[Four Types of GaN Substrate Orientations]
There are four different types I, II, III and IV discriminated by the sets of the growth direction and the slicing planes.

I. MC Type of {1−100}/{0001} (m;C and Mm;C)
The surface of the growing GaN ingot is {1−100} plane. The ingot is sliced in (0001) planes which are parallel to the growing direction. GaN substrates having a (0001) surface are produced (claim 5).

The seed has a {1−100} surface (claim 7). The obtained GaN substrate has a {0001} surface and the dislocations run in the bulk in the {1−100} direction.

II. AC Type of {11−20}/{0001} (a;C and Aa;C)
The surface of the growing GaN ingot is {11−20} plane. The ingot is sliced in (0001) planes which are parallel to the growing direction. GaN substrates having a (0001) surface are produced (claim 6).

The seed has a {11−20} surface (claim 10). The obtained GaN substrate has a {0001} surface and the dislocations run in the bulk in the {11−20} direction.

III. CM Type of {0001}/{1−100} (c;M and Cc;M)
The surface of the growing GaN ingot is {0001} plane. The ingot is sliced in {1−100} planes which are parallel to the growing direction. GaN substrates having a (1−100) surface are produced (claim 13).

The seed has a {0001} surface (claim 14). The obtained GaN substrate has a {1−100} surface and the dislocations run in the bulk in the {0001} direction.

IV. CA Type of {0001}/{11−20} (c;A and Cc;A)
The surface of the growing GaN ingot is {0001} plane. The ingot is sliced in {11−20} planes which are parallel to the growing direction. GaN substrates having a (11−20) surface are produced (claim 17).

The seed has a {0001} surface (claim 18). The obtained GaN substrate has a {11−20} surface and the dislocations run in the bulk in the {0001} direction.

[Methods of Making Four Types of GaN Substrate Orientations]
The four different types I, II, III and IV of GaN substrates are made by the following methods.

I. (Mm) Method of Making an MC Seed of {1−100}/{0001}
A GaN {1−100} seed (M) which is required for growing a GaN ingot in the <1−100> growing direction is made by the following method.

I-α(c;M):
A GaN {1−100} seed (M) is made by growing a GaN ingot in a <0001> growing direction, slicing the GaN ingot in {1−100} planes parallel to the growing direction (claim 8). The symbolic representation is c;M.

I-β(m;M):
A GaN {1−100} seed (M) is made by growing a GaN ingot in a <1−100> growing direction, slicing the GaN ingot in {1−100} planes orthogonal to the growing direction (claim 9). The symbolic representation is m;M.

The GaN {1−100} seed (M) produced by the method of I-α has pits enclosed by slanting facets on the surface. The pits induce concentration of dislocations. But the dislocation density itself is so low that the pits invite no problem.

The seed crystal sliced from a low dislocation density crystal has low density of dislocations. A further dislocation reduction is accomplished by growing a GaN ingot on the seed and slicing the ingot in the planes parallel to the growing direction.

II. (Aa) Method of Making an AC seed of {1−20}/{0001}
A GaN {11−20} seed (A) which is required for growing a GaN ingot in the <11−20> growing direction is made by the following method.

II-α(c;A):
A GaN {11−20} seed (A) is made by growing a GaN ingot in a <0001> growing direction, slicing the GaN ingot in {11−20} planes parallel to the growing direction (claim 11). The symbolic representation is c;A.

II-β(a;A):
A GaN {11−20} seed (A) is made by growing a GaN ingot in a <11−20> growing direction, slicing the GaN ingot in {11−20} planes orthogonal to the growing direction (claim 12). The symbolic representation is a;A.

The GaN {11−20} seed (A) produced by the method of II-α has pits enclosed by slanting facets on the surface. The pits induce concentration of dislocations. But the dislocation density itself is so low that the pits invite no problem.

The seed crystal sliced from a low dislocation density crystal has low density of dislocations. A further dislocation reduction is accomplished by growing a GaN ingot on the seed and slicing the ingot in the planes parallel to the growing direction.

III. (Cc) Method of Making a CM seed of {0001}/{1−100}
A GaN {0001} seed (C) which is required for growing a GaN ingot in the <0001> growing direction is made by the following method.

III-α(a;C):
A GaN {0001} seed (C) is made by growing a GaN ingot in a <11−20> growing direction, slicing the GaN ingot in {0001} planes parallel to the growing direction (claim 15).

The symbolic representation is a;C.

III-β(m;C):

A GaN {0001} seed (C) is made by growing a GaN ingot in a <1–100> growing direction, slicing the GaN ingot in {0001} planes parallel to the growing direction (claim 15). The symbolic representation is m;C.

III-γ(c;C):

A GaN {0001} seed (C) is made by growing a GaN ingot in a <0001> growing direction, slicing the GaN ingot in {0001} planes orthogonal to the growing direction (claim 16). The symbolic representation is c;C.

The methods (a;C, m;C) of making a GaN {0001} seed (C) are based on the invention. Low dislocation seeds are obtained. The use of low dislocation seed allows the GaN ingot to reduce the dislocations further.

The seed crystal sliced from a low dislocation density crystal has low density of dislocations. A further dislocation reduction is accomplished by growing a GaN ingot on the seed and slicing the ingot in the planes parallel to the growing direction.

IV. (Cc) Method of Making a CA seed of {0001}/{11–20}

A GaN {0001} seed (C) which is required for growing a GaN ingot in the <0001> growing direction is made by the following method.

IV-α(a;C):

A GaN {0001} seed (C) is made by growing a GaN ingot in a <11–20> growing direction, slicing the GaN ingot in {0001} planes parallel to the growing direction (claim 19). The symbolic representation is a;C.

IV-β(m;C):

A GaN {0001} seed (C) is made by growing a GaN ingot in a <1–100> growing direction, slicing the GaN ingot in {0001} planes parallel to the growing direction (claim 19). The symbolic representation is m;C.

IV-γ(c;C):

A GaN {0001} seed (C) is made by growing a GaN ingot in a <0001> growing direction, slicing the GaN ingot in {0001} planes orthogonal to the growing direction (claim 20). The symbolic representation is c;C.

The methods (a;C, m;C) of making a GaN {0001} seed (C) are based on the invention. Low dislocation seeds are obtained. The use of low dislocation seed allows the GaN ingot to reduce the dislocations further.

The seed crystal sliced from a low dislocation density crystal has low density of dislocations. A further dislocation reduction is accomplished by growing a GaN ingot on the seed and slicing the ingot in the planes parallel to the growing direction.

[Properties of I, II, III and IV Type GaN Substrates]

[I. MC Type GaN Substrate (4)m;C]

The substrate has a {0001} surface. Dislocations mainly run in the bulk in a <1–100> direction which is parallel to the surface. Low dislocation density is realized by the surface-parallel dislocations (claims 27 and 28).

[II. AC Type GaN Substrate (3)a;C]

The substrate has a {0001} surface. Dislocations mainly run in the bulk in a <11–20> direction which is parallel to the surface. Low dislocation density is realized by the surface-parallel dislocations (claims 29 and 30).

[III. CM Type GaN Substrate (5)c;M]

The substrate has a {1–100} surface. Dislocations mainly run in the bulk in a <0001> direction which is parallel to the surface. Low dislocation density is realized by the surface-parallel dislocations (claims 31 and 32).

[IV. CA Type GaN Substrate (6)c;A]

The substrate has a {11–20} surface. Dislocations mainly run in the bulk in a <0001> direction which is parallel to the surface. Low dislocation density is realized by the surface-parallel dislocations (claims 33 and 34).

[Measurement of the Dislocation Density]

The density of threading dislocations on the surfaces of the GaN substrates of the present invention are measured. It is confirmed that the threading dislocation density is less than $1 \times 10^6$ cm$^{-2}$.

This invention has a cyclic character. This invention can be applied repeatedly upon growing a GaN ingot upon the low dislocation GaN seed which has been made by the teaching of the present invention and slicing the ingot. Namely, this invention is first applied to the preparation of GaN seeds. This invention is secondly applied to the fabrication of substrates which are produced by slicing the GaN ingots grown on the low dislocation seeds. In the case of two step processes, the process can make the best use of the dislocation reduction contrivance of the present invention two times. Twice reduction is realized by twelve modes, (8)c;Aa;C (10)c;Mm;C (7)c;Aa;M (9)c;Mm;A (13)m;Aa;C (14)m;Aa;M (11)m;Cc;A (12)m;Cc;M (15)a;Cc;M (16)a;Cc;A (17)a;Mm;C (18)a;Mm;A.

These twelve modes have the same effect of reducing dislocations. However, in practice, the first growth should be done in a c-axis upon foreign materials having three-rotational symmetry, e.g., GaAs(111). The starting GaN substrates are often restricted to C-surface GaN seeds. Among the twelve modes, more significant ones are the following four modes, (8)c;Aa;C (10)c;Mm;C (7)c;Aa;M (9)c;Mm;A.

Furthermore, C-surface substrates are often required for the final substrates. The most significant modes in the two step processes are, (8)c;Aa;C (10)c;Mm;C.

Besides the mentioned pure modes including only the dislocation reduction steps, hybrid modes alleviating the restrictions are included also within the scope of the present invention. The hybrid modes include a dislocation reduction step and a dislocation maintaining step. Clams 37 and 38 declare the hybrid step substrate production. The dislocation reduction step has already decreased the dislocations. The next step would make low-dislocation density GaN substrates. The dislocation reduction step slices the GaN ingot in the planes parallel to the growth direction. The dislocation maintaining step slices the GaN ingot in the planes orthogonal to the growth direction. The differences lie in the planes of slicing. The two step hybrid modes are, (43)c;Aa;A (44)c;Mm;M (48)m;Aa;A (45)m;Cc;C (46)a;Cc;C (47)a;Mm;M These hybrid modes prepare low dislocation GaN seeds (c;A, c;M, m;A, m;C, a;C, a;M), grow GaN ingots (c;Aa, c;Mm, m;Aa, m;Cc, a;Cc, a;Mm) upon the low dislocation GaN seeds, slice the GaN ingots (c;Aa, c;Mm, m;Aa, m;Cc, a;Cc, a;Mm) in planes (A, M, A, C, C, M) orthogonal to the growth directions (a, m, a, c, c, m) and obtain dislocation half-reduced substrates (c;Aa;A, c;Mm;M, m;Aa;A, m;Cc;C, a;Cc;C, a;Mm;M). claim 39 declares the hybrid mode (45)m;Cc;C. claim 40 declares the hybrid mode (46) a;Cc;C. claim 41 declares the hybrid mode (44)c;Mm;M.

This invention can be realized by various types of vapor phase epitaxy. GaN crystals can be produced by HVPE method (Hydride Vapor Phase Epitaxy), MOCVD method (Metallorganic Chemical Vapor Deposition), MOC method (Metallorganic Chloride Vapor Phase Epitaxy) and Sublimation method. This invention can be also applied to the ultrahigh pressure synthesizing method.

[Prelude to Embodiments]

Embodiments based upon the HVPE method are described. The HVPE method can be replaced by the MOCVD method, the sublimation method or the MOC method.

The HVPE method which has been mentioned by referring to FIG. 1 synthesizes a GaN layer on a substrate by making GaCl gas from a Ga-melt and HCl gas at the upper space in a hot-wall furnace, producing GaN from the GaCl gas and $NH_3$ gas near the substrate and piling the GaN molecules upon the heated substrate.

Five embodiments are classified and represented in the symbols beforementioned by referring to the diagrams of FIG. 19 to FIG. 23 for facilitating apprehension.

Embodiment 1 (55)c;A(6) (56)c;M(5) (57)c;C

Embodiment 2 (58)c;Mm;C(10) (59)c;Mm;M (68)c;Mm;A (9) (69)c;Mm;Aa;C(21)

Embodiment 3 (60)c;Aa;C(8) (61)c;Aa;A (70)c;Aa;M(7) (71)c;Aa;Mm;C(19)

Embodiment 4 (62)c;Mm;Cc;M (63)c;Mm;Cc;A (64)c;Mm;Cc;C

Embodiment 5 (65)c;Aa;Cc;A (66)c;Aa;Cc;M (67)c;Aa;Cc;C

Embodiment 1 produces GaN single crystal seeds A, M and C.

Embodiment 2 grows GaN single crystal ingots m upon the GaN seeds M made by Embodiment 1, slices the GaN ingots m in C-planes and M-planes and obtains substrates C and substrates M.

Embodiment 3 grows GaN single crystal ingots a upon the GaN seeds A made by Embodiment 1, slices the GaN ingots a in C-planes and A-planes and obtains substrates C and substrates A.

Embodiment 4 grows GaN single crystal ingots c upon the GaN seeds C made by Embodiment 2 slices the GaN ingots c in C-planes, M-planes and A-planes and obtains substrates C, substrates M and substrates A.

Embodiment 5 grows GaN single crystal ingots c upon the GaN seeds C made by Embodiment 3 slices the GaN ingots c in C-planes, M-planes and A-planes and obtains substrates C, substrates M and substrates A.

[EMBODIMENT 1: Preparing of Seeds A, M and C (c;A, c;M, c;C)]

First, A-surface GaN substrates, M-surface GaN substrates and C-surface GaN substrates are prepared by growing a C-GaN crystal ingot in a c-direction on a GaAs substrate, slicing the C-GaN ingot in A-planes, M-planes and C-planes, obtaining as-cut A-surface GaN seed substrates, M-surface GaN seed substrates and C-surface GaN seed substrates and polishing the as-cut A-surface GaN seed substrates, M-surface GaN seed substrates and C-surface GaN seed substrates.

(EMBODIMENT 1-a) Substrate

GaAs single crystal wafers are chosen as the starting substrate instead of sapphire. GaAs is cubic and GaN is hexagonal. They have different symmetry. (111) GaAs substrates are employed for harmonizing the symmetry.

(EMBODIMENT 1-b) $SiO_2$ Mask

A $SiO_2$ (silicon dioxide) film is formed upon the overall (111) GaAs substrate to a thickness of 0.1 μm (100 nm) by a plasma CVD method. Windows are perforated on the mask film by photolithography.

(EMBODIMENT 1-c) Formation of Windows on the $SiO_2$ Mask

Figure 2:
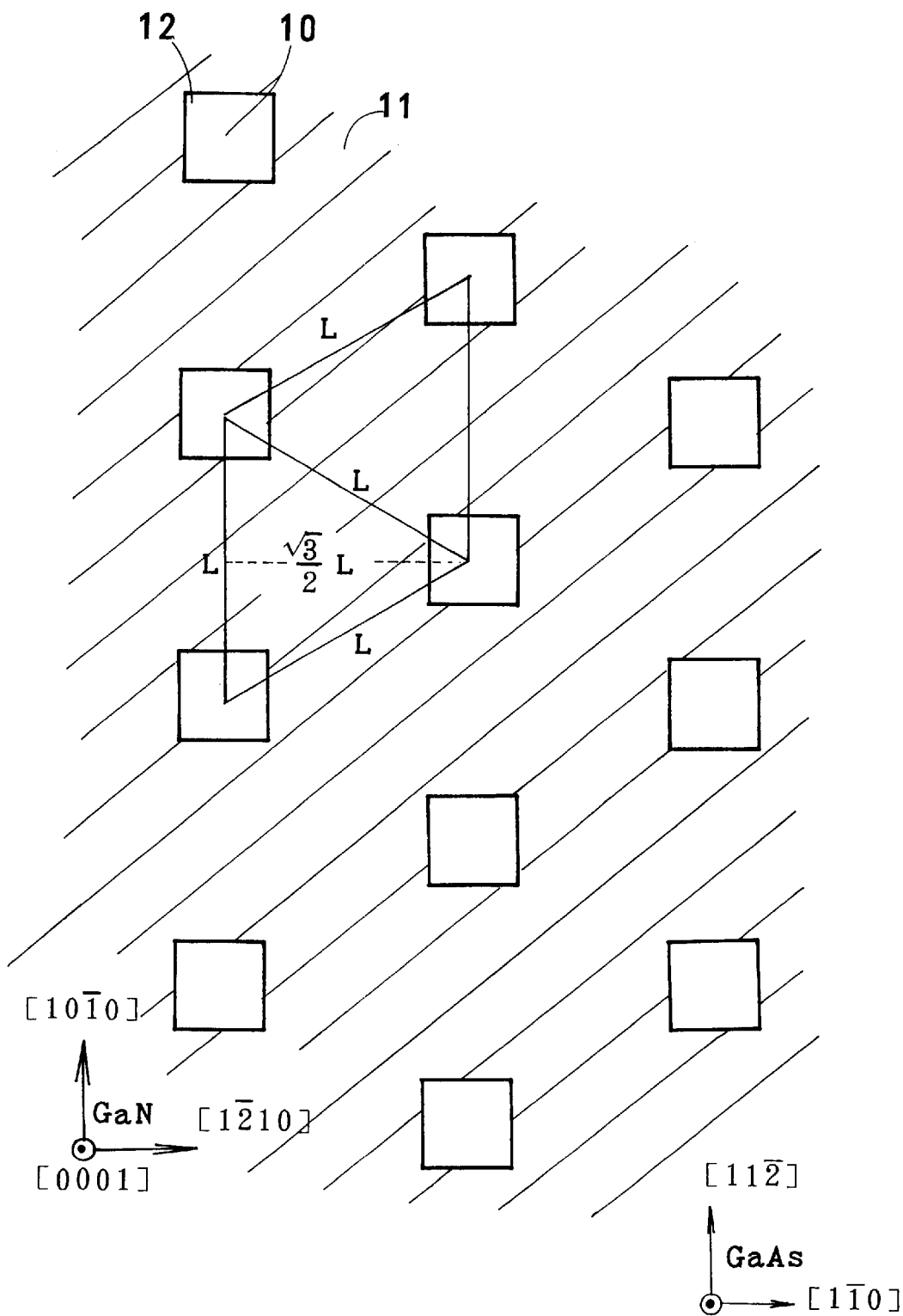
FIG. 2 is a plan view of a (111) GaAs substrate and a mask with square windows being deposited on the (111) GaAs substrate for growing GaN crystals on the substrate by the ELO (epitaxial lateral overgrowth) method.
Figure 3:
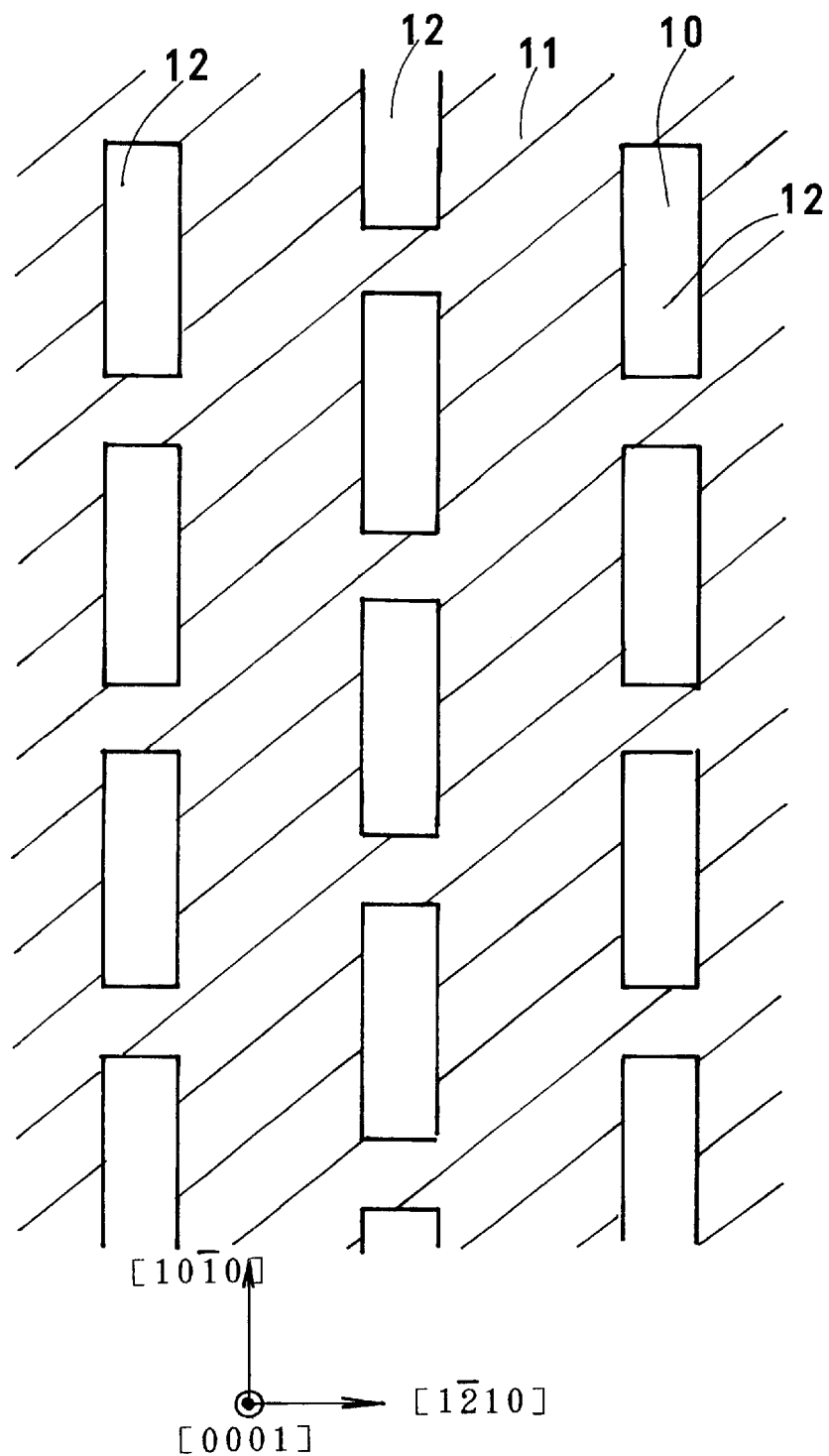
FIG. 3 is a plan view of a (111) GaAs substrate and a mask with stripe windows being deposited on the (111) GaAs substrate for growing GaN crystals on the substrate by the ELO method.

Stripe-shaped, dot-shaped or other shaped windows are available. Here, dot-shaped windows are perforated on the mask. The disposition of the windows is the same as FIG. 2. The square windows are replaced by round dots. The dot has a diameter of about 2 μm. As shown in FIG. 2, a series of windows are regularly aligned along a line extending in a GaAs <11-2> direction by a 4 μm pitch. Another series of windows are also regularly aligned along another line parallel with and being distanced from the former line by 3.5 μm with half pitch off-set. The window pattern on the pairing lines are repeated in the GaAs [1-10] direction which is orthogonal to the GaAs <11-2> direction. Namely all the series of windows deviate by 2 μm in the GaAs <11-2> direction from the neighboring series. Every neighboring three windows are laid on corners of an equilateral triangle of 4 μm sides.

(EMBODIMENT 1-d) HVPE Apparatus

The GaAs substrate with the window-carrying mask is laid upon the susceptor 4 in the furnace 1 of the HVPE apparatus as shown in FIG. 1. The HVPE apparatus is designed to be suitable for a long time growth. A GaN freestanding substrate requires a long time growth of GaN.

The Ga-boat 2 and the susceptor 4 are heated by the heater 6. The Ga is molten in the Ga-boat 2. A mixture of $H_2$ and HCl gas is supplied to the Ga-melt 3 through the gas inlet 7. Another mixture of $H_2$ and $NH_3$ gas is replenished to a space above the susceptor 4 in the furnace 1.

HCl gas with a carrier $H_2$ gas is supplied to the Ga-melt heated at about 800° C. Reaction of HCl with Ga makes gallium chloride (GaCl) vapor. The GaCl vapor flows downward near the heated GaAs substrate 5 and reacts with ammonia gas $NH_3$. The reaction synthesizes GaN. GaN molecules are piled upon the heated GaAs substrate 5. Piling of the GaN makes GaN isolated thin films in the windows upon the GaAs substrate.

(EMBODIMENT 1-e) Formation of GaN Buffer Layers

The HVPE apparatus makes about 80 nm thick buffer layers upon the revealed surface of the GaAs substrate within the windows under the condition,

| | |
|---|---|
| Growing temperature | about 500° C. (about 773 K) |
| $NH_3$ gas partial pressure | 0.2 atm (20 kPa) |
| HCl gas partial pressure | $2 \times 10^{-3}$ atm (0.2 kPa) |
| Growing time | 30 minutes |
| layer thickness | 80 nm. |

The mask $SiO_2$ has a function of rejecting piling of GaN. No GaN film is deposited on the mask. Since the buffer layers (80 nm) are thinner than the thickness (100 nm) of the mask, the buffer layers are enclosed by the window walls and are separated from other buffer layers by the mask material. The buffer layers which are synthesized at a low temperature (500° C.) play the role of alleviating the misfit of the lattice constants between GaN and GaAs.

(EMBODIMENT 1-f) Formation of GaN Epitaxial Layers

A thick epitaxial layer of a 3 cm is further grown on the buffer layer and the mask under the condition,

| | |
|---|---|
| Growing temperature | about 1020° C. (about 1293 K) |
| $NH_3$ gas partial pressure | 0.3 atm (30 kPa) |
| HCl gas partial pressure | $2 \times 10^{-2}$ atm (2 kPa) |

| | |
|---|---|
| Growing time | about 180 hours |
| layer thickness | 3 cm. |

Figure 4:
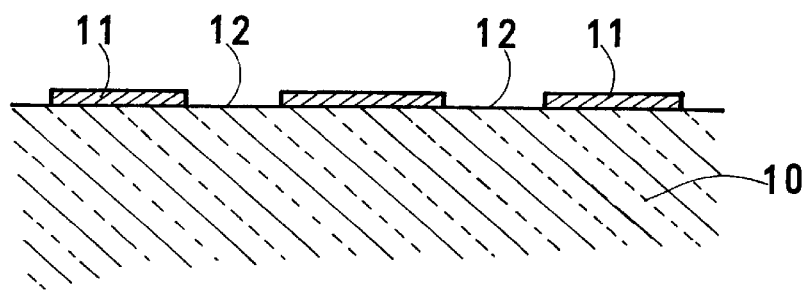
FIG. 4(1) is a section of the (111) GaAs substrate at a preparatory step of the ELO method which deposits a mask film on the GaAs substrate and perforates windows on the mask film.
Figure 4:
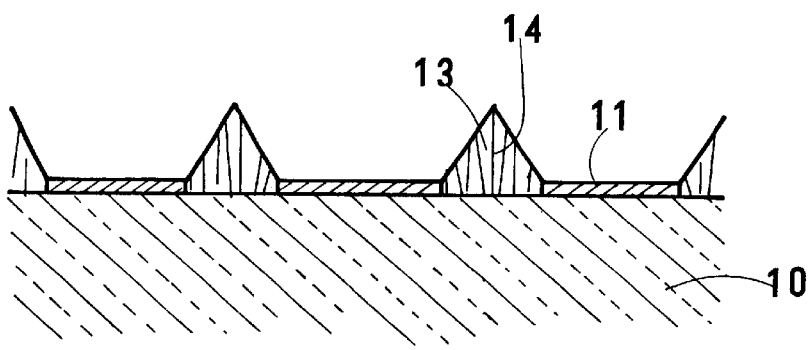
Figure 4:
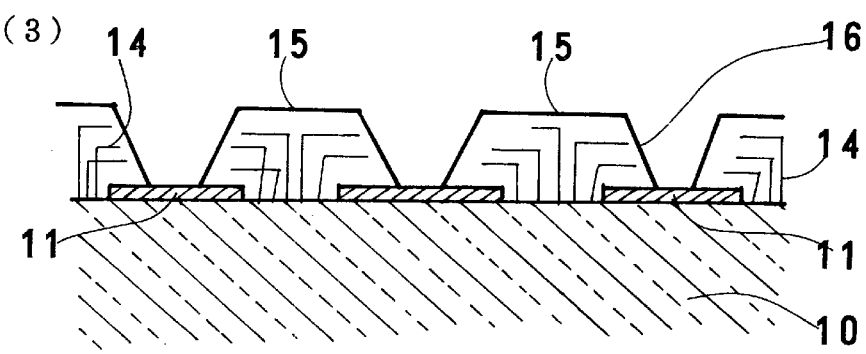
Figure 4:
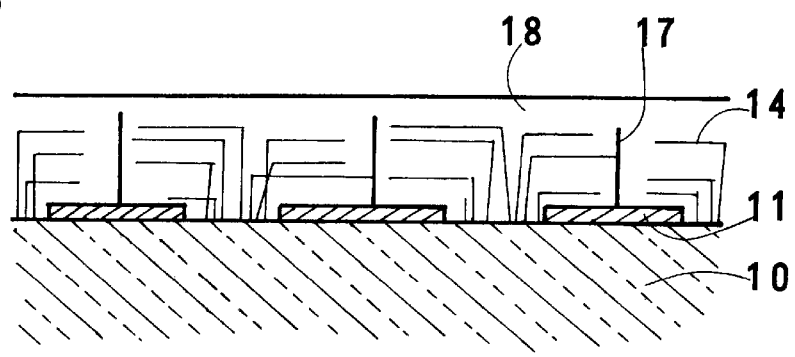
Figure 5:
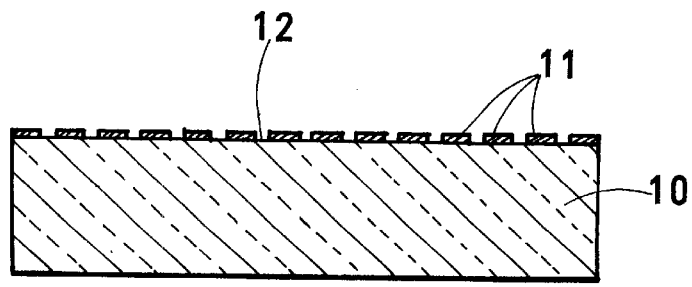
FIG. 5(1) is a section of the GaAs substrate and the mask at a starting step of the ELO method at which the mask is deposited on the substrate and windows are perforated on the mask.
Figure 5:
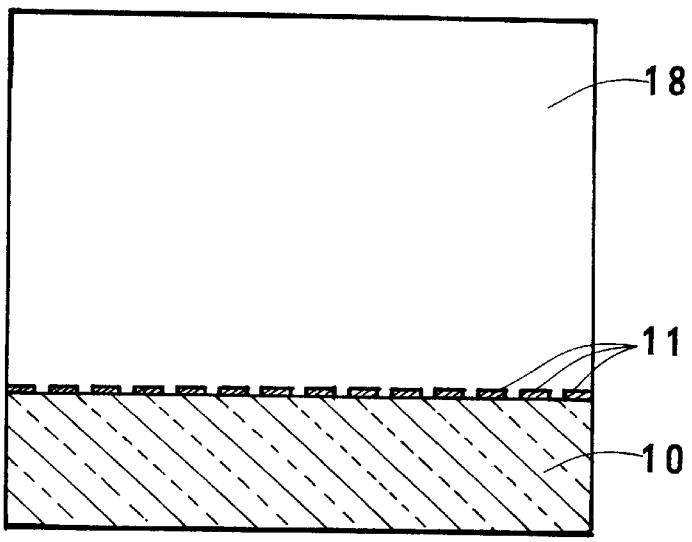
Figure 5:
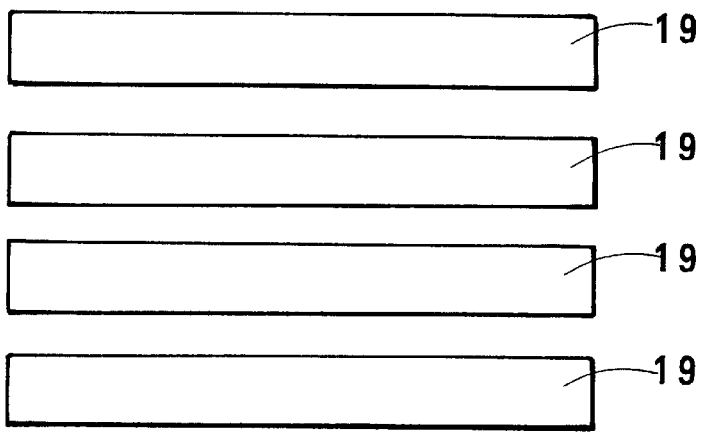
Figure 6:
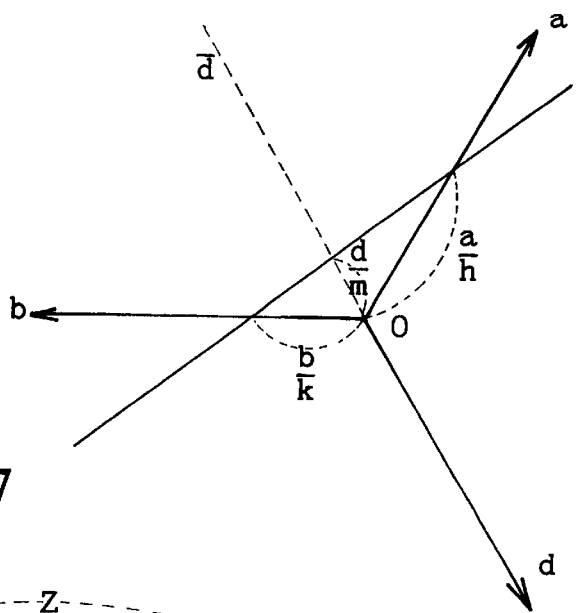
FIG. 6 is an explanatory figure for clarifying a mirror index representation of a (hkm0) plane cutting an a-axis, a b-axis and a d-axis at a/h, b/k and d/m in the hexagonal symmetry coordinate in which the a-axis, the b-axis and the d-axis incline to each other at 120 degrees.
Figure 7:
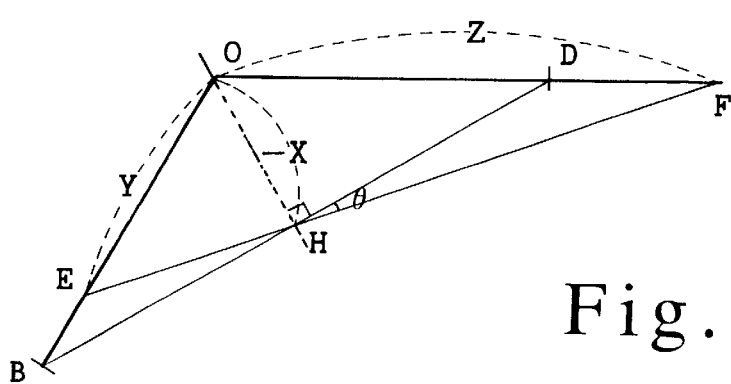
FIG. 7 is an explanatory figure for proving the zero-sum rule that the sum of three mirror indices h, k and m should be zero in the hexagonal symmetry group.
Figure 8:
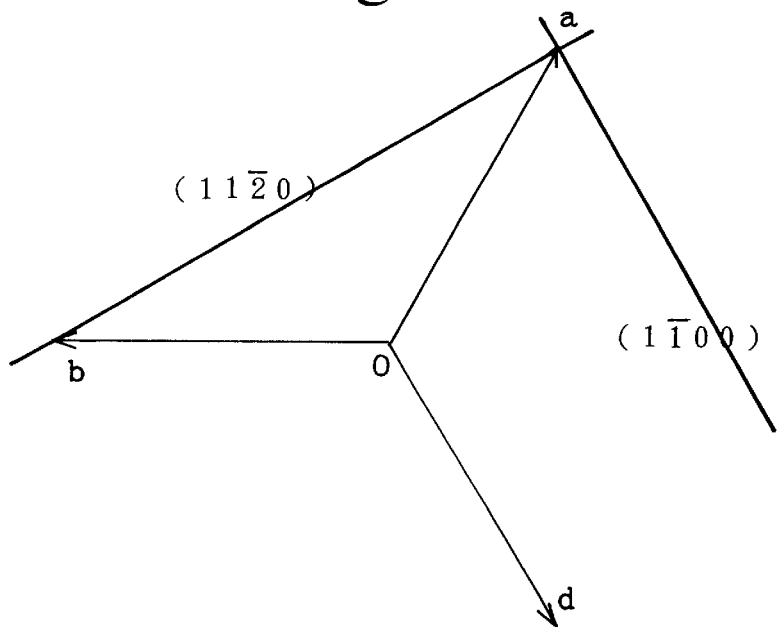
FIG. 8 is an explanatory figure for showing an important (1–100) plane and another important (11–20) plane on the horizontal coordinate with the a-, b- and d- axes in the hexagonal symmetry group.
Figure 9:
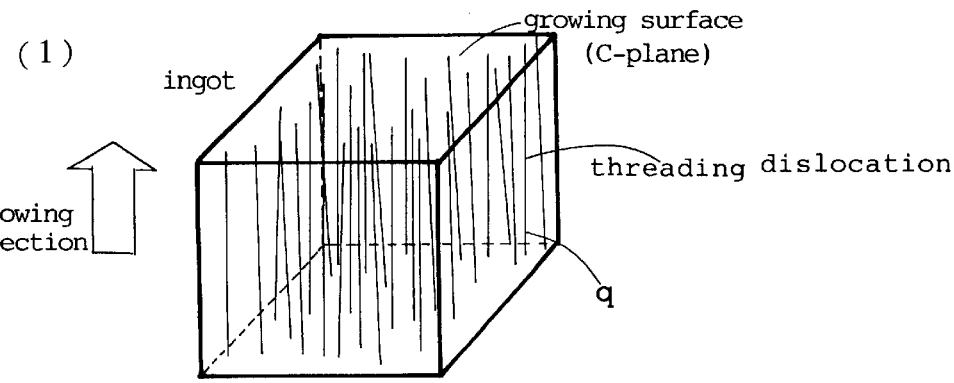
FIG. 9(1) is a perspective view of an ingot grown in the c-axis having threading dislocations vertically extending in parallel with the growing direction (c-axis).
Figure 9:
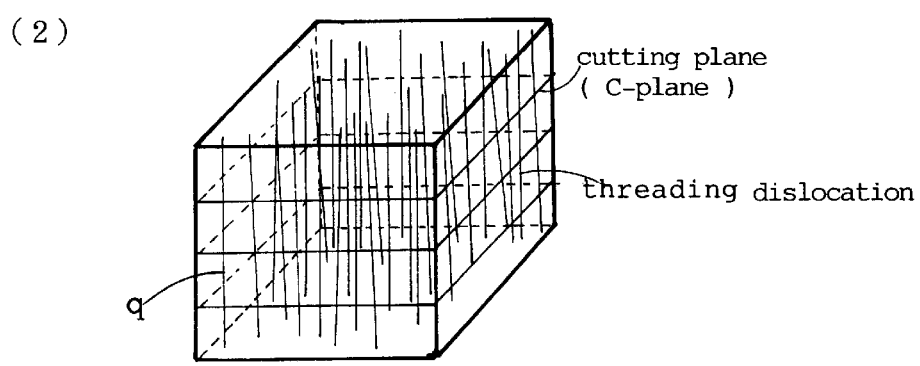
Figure 9:
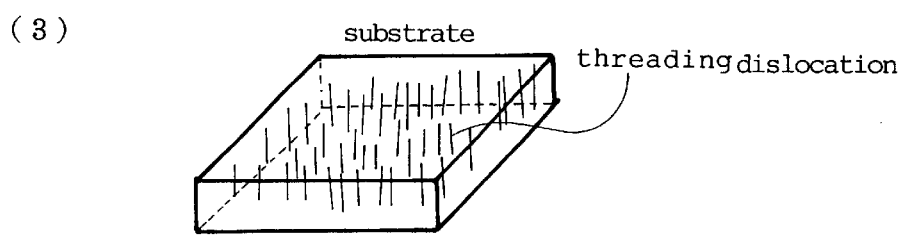
Figure 9:
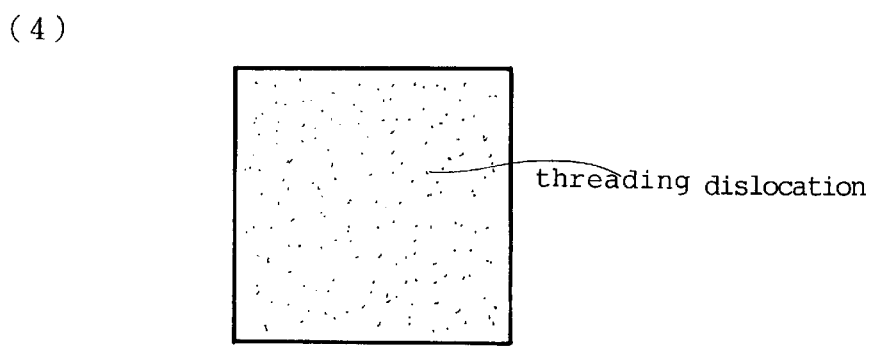
Figure 10:
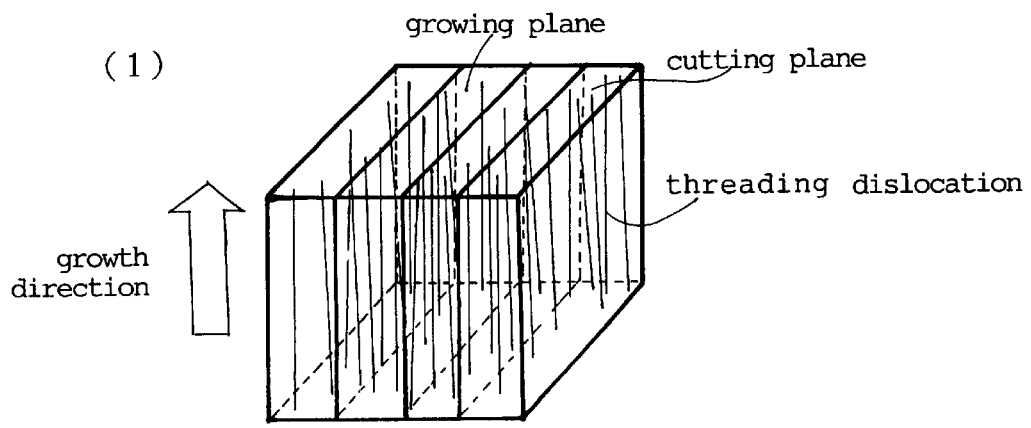
FIG. 10(1) is a perspective view of an ingot having vertically extending threading dislocations and being sliced into several sheets of crystal according to the present invention which cuts parallel threading dislocations by taking cutting planes parallel to the threading dislocations in the ingot.
Figure 10:
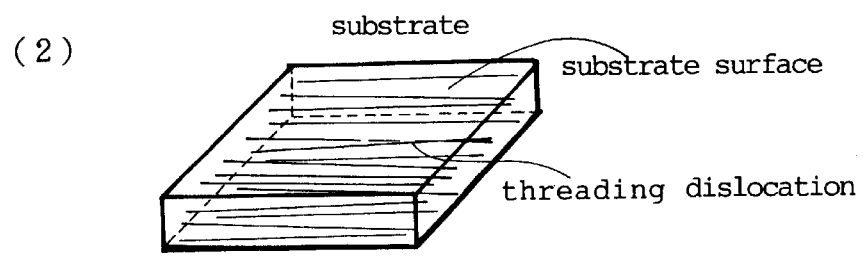
Figure 10:
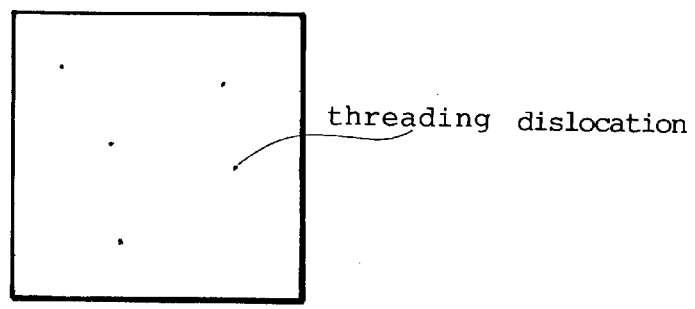
Figure 11:
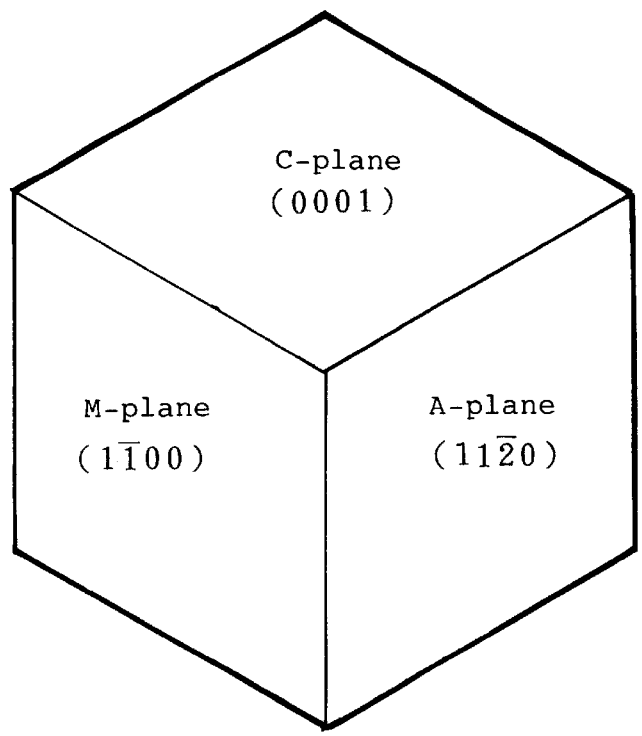
FIG. 11 is a perspective view of a gallium nitride (GaN) schematic cube having a C-plane (0001), an M-plane (1–100) and an A-plane (11–20) for clarifying the fact that the hexagonal symmetry enables some choice to obtain an orthogonal set of a C-plane, an A-plane and an M-plane and for asserting the idea that the conversion of the growing directions allows the present invention to reduce superficial dislocations substantially.
Figure 12:
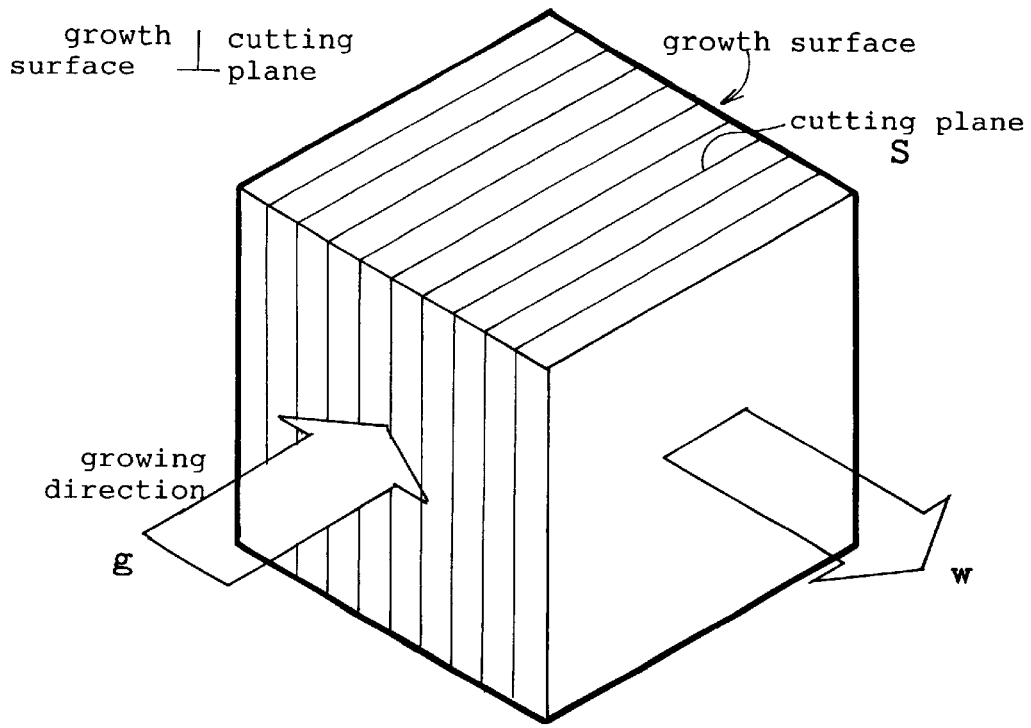
FIG. 12 is a perspective view of a GaN schematic cube for showing the fundamental idea of the present invention that the superficial dislocations are reduced by slicing the GaN ingot in slicing planes S which is parallel to the growing direction g.

The process (FIG. 4(2), FIG. 4(3) and FIG. 4(4)) is done at a high temperature. It takes a long time to grow the 3 cm tall GaN epitaxial layer. The growing direction is a c-axis <0001> direction. Namely, the surface of the growing crystal is a (0001) C-plane. The GaAs substrate is eliminated by etching with aqua regia. A freestanding GaN single crystal ingot is obtained. A GaN ingot which has been grown in the c-direction is named "c" after the growing direction. The GaN ingot is a first generation c-grown ingot. Thus the GaN is denoted by "$c_1$". The suffix designates the generation number.

Electron microscope observation reveals that the surface of the epitaxial GaN layer is accompanied by plenty of pits of inverse hexagonal cones and inverse dodecagonal cones including {11–22} planes and {1–102} planes and many bundles of dislocations extending in the c-direction are accumulated at the bottoms of the pits. Namely, it is confirmed that the extending direction of the dislocations is parallel to the growing direction, that is, the c-axis [0001]. This means q∥g.

(EMBODIMENT 1-g) Production of GaN Seeds ($c_1 \rightarrow M_1$, $A_1$, $C_1$)

Several tall (about 3 cm) GaN ingots are made by the aforementioned process. GaN ingots are sliced in three different planes M, A and C into three different GaN seeds. Three kinds of GaN seeds are prepared. Since these seeds are first generation seeds, suffix it "1" is attached to the seeds.

(1) $M_1$ seed having a {1–100} surface (56)
(2) $A_1$ seed having a {11–20} surface (55)
(3) $C_1$ seed having a {0001} surface. (57)

The GaN ingot has a (0001) surface. An ordinary way would be to slice the ingot in (0001) planes into C-seeds (c;C). This invention makes $M_1$ seeds or $A_1$ seeds by slicing the (0001) ingots in M{1–100} planes or in A{11–20} planes besides the $C_1$ seeds. The symbolic expressions are c;M and c;A for the $M_1$ seed and $A_1$ seed.

(EMBODIMENT 1-h) Estimation of GaN Seeds $C_1$, $M_1$, $A_1$

The properties and characteristics of the GaN seeds $M_1$, $A_1$ and $C_1$ are estimated by etch pit density and cathode luminescence.

(EMBODIMENT 1-h-c) Estimation of GaN Seeds $C_1$(c;C) (57)

Dislocations of the GaN seed $C_1$ having a {0001} surface is estimated by measuring the EPD (Etch Pit Density). The (GaN seed $C_1$) sample is wet-etched by a special etchant which is a mixture of phosphoric acid and sulfuric acid at 250° C. The wet-etching reveals etch pits on the surface.

The electron microscope observation gives evidence of generation of large pits at the parts near the bundles of dislocations and low EPD overall on the surface except the bundles. However, the relation between the revealed etch pits and the inherent dislocations is not clear.

The cathode luminescence (CL) measurement notifies the inventors that the positions of the bundles of dislocations exactly coincide with the spots of the etch pits revealed by the wet-etching.

The diameters of the revealed etch pits range from 1 μm to 10–20 μm which is equal to the size of dislocation bundles.

The threading dislocations have neither uniform distribution nor common sizes on the surface. The dislocations have large fluctuation of size and population. The population of dislocations cannot be represented by a single numeral as density due to the variations of size.

The etch pit density is counted by neglecting the difference of sizes. The counted EPD turns out to be about $5 \times 10^5$ cm$^{-2}$. Prior art GaN crystals on sapphire have more than $10^7$ cm$^{-2}$ EPD. It is confirmed that the present invention succeeds in reducing EPD.

(EMBODIMENT 1-h-m) Estimation of GaN seeds $M_1$(c;M) (56)

EPD of the GaN seed $M_1$ having a {1–100} surface is measured by the same method. A similar reduction of EPD is confirmed also on the surface of the $M_1$ seed. But the {1–100} surface wears pit trains in the [0001] direction. The pit train is not a single pit line but an assembly of concentrated parallel pit lines. There are parallel pit-free regions between the neighboring pit trains. The widths of the pit-free regions are various. The average of the widths of the pit-free regions is about 200 μm.

(EMBODIMENT 1-h-a) Estimation of GaN Seeds $A_1$(c;A) (55)

EPD of the GaN seed $A_1$ having a {11–20} surface is measured by the same method. A similar reduction of EPD is confirmed also on the surface of the $A_1$ seed. But the {11–20} surface wears pit trains in the [0001] direction. The pit train is not a single pit line but an assembly of concentrated parallel pit lines. There are parallel pit-free regions between the neighboring pit trains. The widths of the pit-free regions are various. The average of the widths of the pit-free regions is about 200 μm.

Embodiment 1 prepares three kinds of seeds $C_1$, $A_1$, and $M_1$. Embodiment 2 employs the seed $M_1$ (c;M) as a starting seed for making a GaN crystal ingot. Embodiment 3 employs the seed $A_1$ (c;A) as a starting seed for making a GaN crystal ingot. The GaN growth (C;c) upon the seed $C_1$ is not included in the scope of the present invention.

[EMBODIMENT 2: Production of GaN Ingots $m_2$ on seed $M_1$ (c;Mm)]

GaN ingots $m_2$ are grown on GaN seeds $M_1$ having {1–100} surfaces under the following condition in the same HVPE apparatus as Embodiment 1. The ingot belongs to a second generation, suffix "2" is attached to the symbol m of the grown ingot.

| | |
|---|---|
| Growing temperature | 1020° C. (1293 K) |
| NH$_3$ gas partial pressure | 0.3 atm (30 kPa) |
| HCl gas partial pressure | $2 \times 10^{-2}$ atm (2 kPa) |
| Growing time | about 180 hours |
| ingot thickness | 2.5 cm |

The growing direction is an m-direction <1–100> which is orthogonal to an M-plane {1–100}. The surface of the grown crystal is a {1–100} M-plane. The surface is mirror flat. The height of the ingot $m_2$ is about 2.5 cm.

(EMBODIMENT 2-a) Production of $C_{m\,2}$ Substrates (c;Mm;C) (58)

The GaN ingots $m_2$ is sliced in (0001) planes parallel to the growing direction <1–100> into GaN C-substrate crystals having {0001} surfaces by an inner blade slicer. The process is represented by c;Mm;C. The substrate C is a second generation C-substrate made from the seed $M_1$. Then, the substrate is denoted by $C_{m\,2}$ including the history. The first suffix designates the seed crystal and the second suffix denotes the generation. The $m_2$ GaN ingot bears twenty-five $C_{m\,2}$ substrates by the (0001) slicing.

These $C_{m\,2}$ GaN crystals are rectangle substrates of about 25 mm×30 mm with a 0.7 mm thickness. The $C_{m\,2}$ substrates are polished. Mirror wafers without superficial degradation layer are obtained.

(0001) Ga surfaces of the $C_{m\,2}$ substrates are estimated by the cathode luminescence. Unlike the (0001) Ga surface of the first generation GaN substrate $c_1$, the (0001) Ga surfaces of the $C_{m\,2}$ substrates are improved and free from accumulations of dislocations. The (0001) Ga means a (0001) plane having dangling Ga atoms. The reverse surface is a (000$\bar{1}$) N surface with dangling N atoms. Etch pits are revealed on the $C_{m\,2}$ substrates by the same wet-etching. Big etch pits of diameters of 10 μm to 20 μm are not observed by the electron microscope. All the etch pits are smaller than 1 μm in diameter. Furthermore, the measured EPD is about $1\times10^4$ cm$^{-2}$. The $C_{m\,2}$ substrates turn out to be extremely low dislocation density substrates in comparison with the prior $10^7$ cm$^{-2}$ EPD in the GaN films on sapphire.

TEM observation confirms that the (0001) surface of the $C_{m\,2}$ substrates are nearly free from penetration dislocations. A few dislocations run in a <1–100> direction in parallel to the (0001) surface. Since the ingot $m_2$ grows in the <1–100> m-direction, the extension of dislocations coincides with the <1–100> m-direction. Almost all of the dislocations extend in the bulk of the $C_{m\,2}$ substrate without appearing on the surface, which reduces the superficial dislocations.

The $C_{m\,2}$ is a low dislocation GaN substrate which succeeds in decreasing dislocations on the C-surface by equalizing the dislocation extensions to one direction (m) on the surface (C). The dislocation running direction (m-direction) is the growing direction (m) of the mother ingot which bears the $C_{m\,2}$ substrates. Slicing the mother m-ingot in C-planes produces the $C_{m\,2}$ substrates.

(EMBODIMENT 2-b) Production of $M_{m\,2}$ Substrates (c;Mm;M) (59)

The GaN ingots $m_2$ grown in the m-direction on the C-substrate bears M-substrates by slicing the $m_2$ ingot in M planes. The process is represented by c;Mm;M. Two times of turning the growing directions reduces substantially dislocations. These are second generation slicing the M-plane ingots made from $M_1$. It is confirmed that the $M_{m\,2}$ substrates are endowed with low dislocation.

(EMBODIMENT 2-c) Production of $A_{m\,2}$ Substrates (c;Mm;A) (68)

The GaN ingots $m_2$ grown in the m-direction on the C-substrate bears M-substrates by slicing the $m_2$ ingot in A planes. The process is represented by c;Mm;A. Two times of turning the growing directions reduces substantially dislocations. These are second generation substrates made by slicing the m-direction ingots in A-planes. The substrates are denoted by $A_{m\,2}$. It is confirmed that the $A_{m\,2}$ substrates are endowed with low dislocation.

(EMBODIMENT 2-d) Production of $C_{a\,3}$ Substrates (c;Mm;Aa;C) (69)

Several A-surface GaN single crystal ingots are grown in a <11–20> a-direction on the $A_{m\,2}$ substrate as a seed which is made by twice growths. The A-surface ingot is sliced in (0001) planes into several C-surface (0001) substrates $C_{a\,3}$, which means an ingot made upon an A-surface substrate as the third generation. Full representation of the fabrication of the $C_{a\,3}$ substrates is c;Mm;Aa;C. It is confirmed that the $C_{a\,3}$ substrates are endowed with low dislocation.

[EMBODIMENT 3: Production of GaN Ingots $a_2$ on Seed $A_1$ (c;Aa)]

GaN ingots $a_2$ are grown on GaN seeds $A_1$ having {11–20} surfaces made by Embodiment1 (c;Aa) under the following condition in the same HVPE apparatus as Embodiment 1. The ingot belongs to a second generation, suffix "2" is attached to the symbol a of the grown ingot.

| | |
|---|---|
| Growing temperature | 1020° C. (1293 K) |
| NH$_3$ gas partial pressure | 0.3 atm (30 kPa) |
| HCl gas partial pressure | $2\times10^{-2}$ atm (2 kPa) |
| Growing time | about 180 hours |
| ingot thickness | 2.5 cm |

The growing direction is an a-direction <11–20> which is orthogonal to an A-plane {11–20}. The surface of the grown crystal is a {11–20} M-plane. The surface is partially mirror flat but partially zigzag rough. The rough parts of the surface contain facets mainly built by {1–100} planes. As mentioned before, M{1–100} inclines to M-planes {1–100} not only at 90 degrees but also at 30 degrees, 60 degrees and 150 degrees. The height of the ingot $a_2$ is about 2.5 cm.

(EMBODIMENT 3-a) Production of $C_{a\,2}$ Substrates (c;Aa;C) (60)

The GaN ingots $a_2$ is sliced in (0001) planes parallel to the growing direction <11–20> into GaN C-substrate crystals having {0001} surfaces by an inner blade slicer. The process is represented by c;Aa;C. The substrate C is a second generation C-substrate made from the seed $A_1$. Then, the substrate is denoted by $C_{a\,2}$ including the history. The first suffix designates the seed crystal and the second suffix denotes the generation. The $a_2$ GaN ingot bears twenty-five $C_{a\,2}$ substrates by the (0001) slicing.

These $C_{a\,2}$ GaN crystals are rectangle substrates of about 25 mm×30 mm with a 0.7 mm thickness. The $C_{a\,2}$ substrates are polished. Mirror wafers without superficial degradation layer are obtained.

(0001) Ga surfaces of the $C_{a\,2}$ substrates are estimated by the cathode luminescence. Unlike the (0001) Ga surface of the first generation GaN substrate $c_1$, the (0001) Ga surfaces of the $C_{a\,2}$ substrates are improved and free from accumulations of dislocations. The (0001) Ga means a (0001) plane having dangling Ga atoms. The reverse surface is a (000$\bar{1}$) N surface with dangling N atoms.

Etch pits are revealed on the $C_{a\,2}$ substrates by the same wet-etching. Big etch pits of diameters of 10 μm to 20 μm are not observed by the electron microscope. All the etch pits are smaller than 1 μm in diameter. Furthermore, the measured EPD is about $4\times10^4$ cm$^{-2}$. The $C_{a\,2}$ substrates turn out to be considerably low dislocation density substrates in comparison with the prior $10^7$ cm$^{-2}$ EPD in the GaN films on sapphire.

TEM observation confirms that the (0001) surface of the $C_{a\,2}$ substrates are nearly free from penetration dislocations. A few dislocations run in a <11–20> direction in parallel to the (0001) surface. Since the dislocations do not pierce the surface, the surface is immune from threading dislocation. Since the ingot $a_2$ grows in the <11–20> a-direction, the extension of dislocations coincides with the <11–20> a-direction. Almost all of the dislocations extend in the bulk of the $C_{a\,2}$ substrate without appearing on the surface, which reduces the superficial dislocations.

The $C_{a\,2}$ is a low dislocation GaN substrate which succeeds in decreasing dislocations on the C-surface by equalizing the dislocation extensions to one direction (a) on the surface (C). The dislocation running direction (a-direction) is the growing direction (a) of the mother ingot which bears the $C_{a\,2}$ substrates. Slicing the mother a-ingot in C-planes produces the $C_{a\,2}$ substrates.

(EMBODIMENT 3-b) Production of $A_{a\,2}$ Substrates (c;Aa;A) (61)

The GaN ingots $a_2$ grown in the a-direction on the C-substrate bears A-substrates by slicing the $a_2$ ingot in A planes. The process is represented by c;Aa;A. Two times of turning the growing directions reduces substantially dislocations. These substrates which are second generation and are made by slicing the ingots $a_2$ in A-planes are denoted as $A_{a\ 2}$ It is confirmed that the $A_{a\ 2}$ substrates are endowed with low dislocation.

(EMBODIMENT 3-c) Production of $M_{a\ 2}$ Substrates (c;Aa;M) (70)

The GaN ingots $a_2$ grown in the a-direction on the C-substrate bears A-substrates by slicing the $a_2$ ingot in M{1–100} planes. The process is represented by c;Aa;M. Two times of turning the growing directions reduces substantially dislocations. These are second generation substrates made by slicing the A-plane ingots in M-planes. They are denoted by $M_{a\ 2}$. It is confirmed that the $M_{a\ 2}$ substrates are endowed with low dislocation.

(EMBODIMENT 3-d) Production of $C_{m\ 3}$ Substrates (c;Aa;Mm;C) (71)

Several M-surface GaN single crystal ingots are grown in a <1–100> m-direction on the $M_{a\ 2}$ substrate as a seed which is made by twice growths. The M-surface ingot is sliced in (0001) planes into several C-surface (0001) substrates $C_{m\ 3}$. The substrates are made from the m ingot and belong to third generation. The substrates are designated as $C_{m\ 3}$. Full representation of the fabrication of the $C_{m\ 3}$ substrates is c;Aa;Mm;C. It is confirmed that the $C_{m\ 3}$ substrates are endowed with low dislocation.

[EMBODIMENT 4: Production of GaN Ingots $c_3$ on Seed $C_2$ (c;Mm;Cc)]

GaN ingots $c_3$ are grown on GaN seeds $C_{m\ 2}$ having {0001} surfaces made by Embodiment 2 (c;Mm;C) under the following condition in the same HVPE apparatus as Embodiment 1. The ingot belongs to a third generation, suffix "3" is attached to the symbol c of the grown ingot. The symbolic expression is c;Mm;Cc.

| | |
|---|---|
| Growing temperature | 1020° C. (1293 K) |
| NH$_3$ gas partial pressure | 0.3 atm (30 kPa) |
| HCl gas partial pressure | 2 × 10$^{-2}$ atm (2 kPa) |
| Growing time | about 180 hours |
| ingot thickness | 3 cm |

The growing direction is a c-direction <0001> which is orthogonal to the (0001) C-surface of the seed $C_2$. The surface of the grown crystal $c_3$ is a {0001} C-plane. The surface is mainly mirror flat but partially zigzag rough. The rough parts of the surface contain pits built by facets. The height of the ingot $c_3$ is about 3 cm.

(EMBODIMENT 4-a) Production of $C_{c\ 3}$ Substrates (c;Mm;Cc;C) (64)

The GaN ingots $c_3$ is sliced in (0001) planes orthogonal to the growing direction <0001> into thirty (30) GaN C-substrate crystals having {0001} surfaces by an inner blade slicer. The process is represented by c;Mm;Cc;C. The substrate C is a third generation C-substrate made from the seed $C_2$. Then, the substrate is denoted by $C_{c\ 3}$ including the history. The first suffix designates the preceding seed crystal and the second suffix denotes the generation.

These $C_{c\ 3}$ GaN crystals are rectangle substrates of about 30 mm×30 mm with a 0.7 mm thickness. The $C_{c\ 3}$ substrates are polished. Mirror wafers without superficial degradation layer are obtained.

(0001) Ga surfaces of the Cc substrates are estimated by the cathode luminescence. Unlike the (0001) Ga surface of the first generation GaN substrate $c_1$, the (0001) Ga surfaces of the $C_{c\ 3}$ substrates are improved and free from accumulations of dislocations. The (0001) Ga means a (0001) plane having dangling Ga atoms. The reverse surface is a (0001) N surface with dangling N atoms.

Etch pits are revealed on the $C_{c\ 3}$ substrates by the same wet-etching as former embodiments. Big etch pits of diameters of 10 μm to 20 μm are not observed by the electron microscope. All the etch pits are smaller than 1 μm in diameter. Furthermore, the measured EPD is about 1×10$^4$ cm$^{-2}$. The $C_{c\ 3}$ substrates turn out to be extremely low dislocation density substrates in comparison with the prior 10$^7$ cm$^{-2}$ EPD in the GaN films on sapphire.

TEM observation confirms that the (0001) surface of the $C_{c\ 3}$ substrates are nearly free from penetration dislocations. A few dislocations run in a <11–20> a-direction or a <1–100> m-direction in parallel to the (0001) C surface. Since the dislocations do not pierce the surface, the surface is immune from threading dislocation. Since the ingot $c_3$ grew in the <0001> c-direction on the (0001) $C_{m2}$-substrate, the $C_3$ succeeds the dislocations of the $C_2$ substrate. However, $C_2$ substrate has still small density of dislocation, because $C_2$ substrate is made from the m ingot. The conversion from c to m and the conversion from m to c reduces the dislocations on the $C_2$ substrate as shown in FIG. 22(64).

(EMBODIMENT 4-b) Production of $M_{c\ 3}$ Substrates (c;Mm;Cc;M) (62)

The GaN ingots $c_3$ grown in the c-direction on the $C_2$-substrate is sliced in {1–100} M planes into thirty (30) {1–100} M substrates. The cutting (slicing) M-planes are parallel to the c-growing direction. The process is represented by c;Mm;Cc;M. Three times of turning the growing directions reduces substantially dislocations. These substrates which are third generation and are made by slicing the C-plane ingots $c_3$ are denoted as $M_{c\ 3}$. This process makes 30 $M_{c\ 3}$ substrates.

These 30 $M_{c\ 3}$ GaN crystals are rectangle substrates of about 30 mm×25 mm with a 0.7 mm thickness. The $M_{c\ 3}$ substrates are polished. Mirror wafers without superficial degradation layer are obtained.

{1–100} surfaces of the $M_{c\ 3}$ substrates are estimated by the cathode luminescence. Unlike the (0001)Ga surface of the first generation GaN substrate $c_1$, the {1–100} surfaces of the $M_{c\ 3}$ substrates are improved and free from accumulations of dislocations. The (0001) Ga means a (0001) plane having dangling Ga atoms. The reverse surface is a (0001) N surface with dangling N atoms.

Etch pits are revealed on the $M_{c\ 3}$ substrates by the same wet-etching as former embodiments. Big etch pits of diameters of 10 μm to 20 μm are not observed by the electron microscope. All the etch pits are smaller than 1 μm in diameter. Furthermore, the measured EPD is about 8×10$^3$ cm$^{-2}$. The $M_{c\ 3}$ substrates turn out to be extremely low dislocation density substrates in comparison with the prior 10$^7$ cm$^{-2}$ EPD in the GaN films on sapphire.

TEM observation confirms that the {1–100} surface of the $M_{c\ 3}$ substrates are nearly free from penetration dislocations. A few dislocations run in a <11–20> a-direction or a <0001> c-direction in parallel to the {1–100} M surface. Since the dislocations do not pierce the surface, the surface is immune from threading dislocation. Since the ingot $C_3$ grows in the <0001> c-direction on the (0001) $C_2$-substrate, the $C_3$ succeeds the dislocations of the $C_2$ substrate. However, $C_2$ substrate has still small density of dislocations, because $C_2$ substrate is made from the m ingot. The conversion from c to m and the conversion from m to c reduced the dislocations on the $C_2$ substrate as shown in FIG. 20(58). The third conversion from c to m decreases further the dislocations as shown in FIG. 22(62). These are ideal GaN single crystal substrates.

(EMBODIMENT 4-c) Production of $A_{c\ 3}$ Substrates (c;Mm;Cc;A) (63)

The GaN ingots $c_3$ grown in the c-direction on the $C_2$-substrate is sliced in $\{11\text{-}20\}$ A planes into thirty (30) $\{11\text{-}20\}$ A substrates. The cutting (slicing) A-planes are parallel to the c-growing direction. The process is represented by c;Mm;Cc;A. Three times of turning the growing directions reduces substantially dislocations. These substrates which are third generation and are made by slicing the C-plane ingots $c_3$ are denoted as $A_{c\ 3}$. This process makes 30 $A_{c\ 3}$ substrates.

These 30 $A_{c\ 3}$ GaN crystals are rectangle substrates of about 30 mm×25 mm with a 0.7 mm thickness. The $A_{c\ 3}$ substrates are polished. Mirror wafers without superficial degradation layer are obtained.

$\{11\text{-}20\}$ surfaces of the $A_{c\ 3}$ substrates are estimated by the cathode luminescence. Unlike the (0001)Ga surface of the first generation GaN substrate $c_1$, the $\{11\text{-}20\}$ surfaces of the $A_{c\ 3}$ substrates are improved and free from accumulations of dislocations. The (0001) Ga means (0001) plane having dangling Ga atoms. The reverse surface is a (000$\bar{1}$) N surface with dangling N atoms.

Etch pits are revealed on the $A_{c\ 3}$ substrates by the same wet-etching as former embodiments. Big etch pits of diameters of 10 μm to 20 μm are not observed by the electron microscope. All the etch pits are smaller than 1 μm in diameter. Furthermore, the measured EPD is about $1\times10^4$ $cm^{-2}$. The $A_{c\ 3}$ substrates turn out to be extremely low dislocation density substrates in comparison with the prior $10^7$ cm$^{-2}$ EPD in the GaN films on sapphire.

TEM observation confirms that the $\{11\text{-}20\}$ surface of the $A_{c\ 3}$ substrates are nearly free from penetration dislocations. A few dislocations run in a <1-100> m-direction or a <0001> c-direction in parallel to the $\{11\text{-}20\}$ A surface. Since the dislocations do not pierce the surface, the surface is immune from threading dislocation. Since the ingot $c_3$ grows in the <0001> c-direction on the (0001) $C_{m2}$-substrate, the $C_3$ succeeds the dislocations of the $C_2$ substrate. However, $C_2$ substrate has still small density of dislocations, because $C_2$ substrate is made from the m ingot. The conversion from c to m and the conversion from m to c reduced the dislocations on the $C_2$ substrate. The third conversion from c to a decreases further the dislocations as shown in FIG. 22(63). These are ideal GaN single crystal substrates.

[EMBODIMENT 5: Production of GaN Ingots $c_3$ on Seed $C_2$ (c;Aa;Cc)]

GaN ingots $c_3$ are grown on GaN seeds $C_{a\ 2}$ having $\{0001\}$ surfaces made by Embodiment 3 (c;Aa;C) under the following condition in the same HVPE apparatus as Embodiment 1. The ingot belongs to a third generation, suffix "3" is attached to the symbol c of the grown ingot. The symbolic expression is c;Aa;Cc.

| | |
|---|---|
| Growing temperature | 1020° C. (1293 K) |
| NH$_3$ gas partial pressure | 0.3 atm (30 kPa) |
| HCl gas partial pressure | $2 \times 10^{-2}$ atm (2 kPa) |
| Growing time | about 180 hours |
| ingot thickness | 2.7 cm |

The growing direction is a c-direction <0001> which is orthogonal to the (0001) C-surface of the seed $C_2$. The surface of the grown crystal $c_3$ is a $\{0001\}$ C-plane. The surface is mainly mirror flat but partially zigzag rough. The rough parts of the surface contain pits built by facets. The height of the ingot $c_3$ is about 2.7 cm.

(EMBODIMENT 5-a) Production of $C_{c\ 3}$ substrates (c;Aa;Cc;C) (67)

The GaN ingots $c_3$ is sliced in (0001) planes orthogonal to the growing direction <0001> into thirty (30) GaN C-substrate crystals having $\{0001\}$ surfaces by an inner blade slicer. The slicing traversed the dislocations. The process is represented by c;Aa;Cc;C. The substrate C is a third generation C-substrate made from the seed $C_1$. Then, the substrate is denoted by $C_{c\ 3}$ including the short history. The first suffix designates the preceding seed crystal and the second suffix denotes the generation.

These $C_{c\ 3}$ GaN crystals are rectangle substrates of about 30 mm×25 mm with a 0.7 mm thickness, which correspond to 1 inch size wafers. The $C_{c\ 3}$ substrates are polished. Mirror wafers $C_{c\ 3}$ without superficial degradation layer are obtained.

(0001) Ga surfaces of the $C_{c\ 3}$ substrates are estimated by the cathode luminescence. Unlike the (0001) Ga surface of the first generation GaN substrate $c_1$, the (0001)Ga surfaces of the $C_{c\ 3}$ substrates are improved and free from accumulations of dislocations. The (0001) Ga means (0001) plane having dangling Ga atoms. The reverse surface is a (000$\bar{1}$) N surface with dangling N atoms.

Etch pits are revealed on the $C_{c\ 3}$ substrates by the same wet-etching as former embodiments. Big etch pits of diameters of 10 μm to 20 μm are not observed by the electron microscope. All the etch pits are smaller than 1 μm in diameter. Furthermore the measured EPD is about $5\times10^7$ cm$^{-2}$. The $C_{c\ 3}$ substrates turn out to be considerably low dislocation density substrates in comparison with the prior $10^7$ cm$^{-2}$ EPD in the GaN films on sapphire.

TEM observation confirms that the (0001) surface of the $C_{c\ 3}$ substrates are nearly free from penetration dislocations. A few dislocations run in a <11-20> a-direction or a <1-100> m-direction in parallel to the (0001)C surface. Since the dislocations do not pierce the surface, the surface is immune from threading dislocation. Since the ingot $c_3$ grows in the <0001> c-direction on the (0001) $C_2$-substrate, the $c_3$ succeeds the dislocations of the $C_2$ substrate. However, $C_2$ substrate has still small density of dislocations, because $C_2$ substrate is made from the a ingot. The conversion from c to a and the conversion from a to c reduced the dislocations on the $C_2$ substrate as shown in FIG. 23(67).

(EMBODIMENT 5-b) Production of $M_{c\ 3}$ Substrates (c;Aa;Cc;M) (66)

The GaN ingots $c_3$ grown in the c-direction on the $C_2$-substrate is sliced in $\{1\text{-}100\}$ M planes into thirty (30) $\{1\text{-}100\}$ M substrates. The cutting (slicing) $\{1\text{-}100\}$ M-planes are parallel to the <0001> c-growing direction. The process is represented by c;Aa;Cc;M. Three times of turning the growing directions reduces substantially dislocations. These substrates which are third generation and are made by slicing the C-plane ingots $c_3$ are denoted as $M_{c\ 3}$. This process makes 30 $M_{c\ 3}$ substrates.

These 30 $M_{c\ 3}$ GaN crystals are rectangle substrates of about 30 mm×25 mm with a 0.7 mm thickness. The $M_{c\ 3}$ substrates are polished. Mirror wafers without superficial degradation layer are obtained.

$\{1\text{-}100\}$ surfaces of the $M_{c\ 3}$ substrates are estimated by the cathode luminescence. Unlike the (0001)Ga surface of the first generation GaN substrate $c_1$, the $\{1\text{-}100\}$ surfaces of the $M_{c\ 3}$ substrates are improved and free from accumulations of dislocations.

Etch pits are revealed on the $M_{c\ 3}$ substrates by the same wet-etching as former embodiments. Big etch pits of diameters of 10 μm to 20 μm are not observed by the electron microscope. All the etch pits are smaller than 1 μm in diameter. Furthermore, the measured EPD is about $1\times10^4$ cm$^{-2}$. The $M_{c\ 3}$ substrates turn out to be extremely low dislocation density substrates in comparison with the prior $10^7$ cm$^{-2}$ EPD in the GaN films on sapphire.

TEM observation confirms that the {1-100} surface of the $M_{c\ 3}$ substrates are nearly free from penetration dislocations. A few dislocations run in a <11-20> a-direction or a <0001> c-direction in parallel to the {1-100} M surface. Since the dislocations do not pierce the surface, the surface is immune from threading dislocation. Since the ingot $c_3$ grows in the <0001> c-direction on the (0001) $C_{a2}$-substrate, the $c_3$ succeeds the dislocations of the $C_2$ substrate. However, $C_2$ substrate has still small density of dislocations, because $C_2$ substrate is made from the a ingot. The conversion from c to a and the conversion from a to c reduced the dislocations on the $C_2$ substrate as shown in FIG. 21(60). The third conversion from c to m decreases further the dislocations as shown in FIG. 23(66). These are ideal GaN single crystal substrates.

(EMBODIMENT 5-c) Production of $A_{c\ 3}$ Substrates (c;Aa;Cc;A) (65)

The GaN ingots $c_3$ grown in the c-direction on the $C_2$-substrate is sliced in {11-20} A planes into thirty (30) {11-20} A substrates. The cutting (slicing) A-planes are parallel to the c-growing direction. The process is represented by c;Aa;Cc;A. Three times of turning the growing directions reduces substantially dislocations. These substrates which are third generation and are made by slicing the C-plane ingots $c_3$ are denoted as $A_{c\ 3}$. This process makes 30 $A_{c\ 3}$ substrates.

These 30 $A_{c\ 3}$ GaN crystals are rectangle substrates of about 30 mm×25 mm with a 0.7 mm thickness, which corresponds to 1 inch size wafers. The $A_{c\ 3}$ substrates are polished. Mirror wafers without superficial degradation layer are obtained. {11-20} surfaces of the $A_{c\ 3}$ substrates are estimated by the cathode luminescence. Unlike the (0001)Ga surface of the first generation GaN substrate $c_1$, the {11-20} surfaces of the $A_{c\ 3}$ substrates are improved and free from accumulations of dislocations.

Etch pits are revealed on the $A_{c\ 3}$ substrates by the same wet-etching as former embodiments. Big etch pits of diameters of 10 μm to 20 μm are not observed by the electron microscope. All the etch pits are smaller than 1 μm in diameter. Furthermore the measured EPD is about $2\times10^4$ cm$^{-2}$. The $A_{c\ 3}$ substrates turn out to be extremely low dislocation density substrates in comparison with the prior $10^7$ cm$^{-2}$ EPD in the GaN films on sapphire.

TEM observation confirms that the {11-20} A surface of the $A_{c\ 3}$ substrates are nearly free from penetration dislocations. A few dislocations run in a <1-100> m-direction or a <0001> c-direction in parallel to the {11-20} A surface. Since the dislocations do not pierce the surface, the surface is immune from threading dislocation. Since the ingot $c_3$ grows in the <0001> c-direction on the (0001) $C_{a2}$-substrate, the $c_3$ succeeds the dislocations of the $C_2$ substrate. However, $C_2$ substrate has still small density of dislocations, because $C_2$ substrate is made from the a ingot. The conversion from c to a and the conversion from a to c reduced the dislocations on the $C_2$ substrate. The third conversion from c to a decreases further the dislocations as shown in FIG. 23(65). These are ideal GaN single crystal substrates.

What we claim is:

1. A method of making a gallium nitride single crystal substrate comprising the steps of:
    growing a {1-100} single crystal gallium nitride single ingot on a {1-100} GaN seed crystal substrate in the <1-100> growing direction;
    slicing the {1-100} GaN single crystal ingot in (0001) planes parallel to the <1-100> growing direction; and
    obtaining (0001) GaN single crystal substrates.

2. The method according to claim 1, wherein the {1-100} GaN seed crystal substrate is obtained by growing a (0001) GaN single crystal ingot in a <0001> growing direction and slicing the (0001) GaN single crystal ingot in {1-100} planes parallel to the growing direction <0001> .

3. The method according to claim 2, wherein the {1-100} GaN seed crystal substrate is obtained by growing a {11-20} GaN single crystal ingot in a <11-20> growing direction and slicing the {11-20} GaN single crystal ingot in {1-100} planes parallel to the growing direction <11-20> .

4. A method of making a gallium nitride single crystal substrate comprising:
    growing the {11-20} single crystal gallium nitride ingot on a {11-20} GaN seed crystal substrate in a <11-20> growing direction;
    slicing the {11-20} GaN single crystal ingot in (0001) planes parallel to the <11-20> growing direction; and
    obtaining (0001) GaN single crystal substrates.

5. The method according to claim 4, wherein the {11-20} GaN seed crystal substrate is obtained by growing a (0001) GaN single crystal ingot in a <0001> growing direction and slicing the (0001) GaN single crystal ingot in {11-20} planes parallel to the growing direction <0001>.

6. The method according to claim 4, wherein the {11-20} GaN seed crystal substrate is obtained by growing a {1-100} GaN single crystal ingot in a <1-100>growing direction and slicing the {1-100} GaN single crystal ingot in {11-20} planes parallel to the growing direction <1-100>.

7. A method of making gallium nitride single crystal comprising:
    growing a {0001} single crystal gallium nitride ingot in a {0001} GaN seed crystal substrate in a <0001> growing direction;
    slicing the {0001} GaN single crystal ingot in {1-100} planes parallel to the <0001> growing direction; and
    obtaining {1-100} GaN single crystal substrates.

8. The method according to claim 7, wherein the {0001} GaN seed crystal substrate is obtained by growing a {11-20} or {1-100} GaN single crystal ingot in a <11-20> or <1-100> growing direction and slicing the {11-20} or {1-100} GaN single crystal ingot in {0001} planes parallel to the <11-20> or <1-100> growing direction.

9. The method according to claim 7, wherein the {0001} GaN seed crystal substrate is obtained by growing a {0001} GaN single crystal ingot in a <0001> growing direction and slicing the {0001} GaN single crystal ingot in {0001} planes.

10. A method of making a gallium nitride single crystal substrate comprising:
    growing the {0001} gallium nitride single crystal ingot on a {0001} GaN seed crystal substrate in the <0001> growing direction;
    slicing the {0001} GaN single crystal ingot in {11-20} planes parallel to the <0001> growing direction; and
    obtaining {11-20} GaN single crystal substrates.

11. The method according to claim 10, wherein the {0001} GaN seed crystal substrate is obtained by growing a {11-20} or {1-100} GaN single crystal ingot in a <11-20> or <1-100> growing direction and slicing the {11-20} or {1-100} GaN single crystal ingot in {0001} planes parallel to the <11-20> or <1-100> growing direction.

12. The method according to claim 10, wherein the {0001} GaN seed crystal substrate is obtained by growing a {0001} GaN single crystal ingot in a <0001> growing direction and slicing the {0001} GaN single crystal ingot in {0001} planes.

13. A gallium nitride single crystal substrate having surfaces and containing threading dislocations extending in parallel with the surface, wherein parallelism of the dislocations to the surface reduces the threading dislocations appearing on the surface by hiding almost all of the threading dislocations below the surface and allowing a few of the threading dislocations to appear on the surface.

14. A gallium nitride single crystal substrate having surfaces and containing threading dislocations extending in parallel with the surface, wherein one direction parallelism of the dislocations to the surface reduces the threading dislocations below the surface and allowing a few of the threading dislocations to appear on the surface.

15. The gallium nitride single crystal substrate according to claim 13, wherein threading dislocation density is less than $1\times10^6$ cm$^{-2}$ on the surface.

16. A method of making a gallium nitride single crystal substrate comprising:
growing a gallium nitride single crystal ingot in a growing direction;
slicing the GaN single crystal ingot in planes parallel to the growing direction into GaN seed single crystals;
obtaining the GaN seed single crystals having surfaces, a bulk between the surfaces, threading dislocations running within the bulk in a direction parallel to the surface and a few threading dislocations appearing on the surface;
growing a gallium nitride single crystal ingot in a growing direction on the GaN seed crystal;
slicing the GaN single crystal ingot in planes orthogonal to the growing direction into GaN single substrates; and
obtaining the GaN single crystal substrates having surfaces, a bulk between the surfaces and threading dislocations running in a direction orthogonal to the surface.

17. A method of making a gallium nitride single crystal substrate comprising:
preparing a GaN seed single crystal having surfaces, a bulk between the surfaces, threading dislocations running within the bulk in a direction parallel to the surface and a few threading dislocations appearing on the surface;
growing a gallium nitride single crystal ingot in a growing direction on the GaN seed single crystal;
slicing the GaN single crystal ingot in planes orthogonal to the growing direction into GaN single substrates; and
obtaining the GaN single crystal substrates having surfaces, a bulk between the surfaces and threading dislocations running in a direction orthogonal to the surface.

18. The method according to claim 16, comprising growing a {1–100} gallium nitride single crystal ingot in a <1–100> growing direction, slicing the {1–100} GaN single crystal ingot in (0001) planes parallel to the <1–100> growing direction into (0001) seed crystals, obtaining the (0001) seed crystals having surfaces, a bulk between the surfaces, threading dislocations running within the bulk in the <1–100> direction parallel to the (0001) surface, growing a (0001) gallium nitride single crystal ingot in a <0001> growing direction on the (0001) GaN seed crystal, slicing the (0001) GaN single crystal ingot in (0001) planes orthogonal to the <0001> growing direction into (0001) GaN single substrates, obtaining the (0001) GaN single crystal substrates having (0001) surfaces, a bulk between the surfaces and threading dislocations running in the <0001> direction orthogonal to the (0001) surface.

19. The method according to claim 16, comprising growing a {11–20} gallium nitride single crystal ingot in a <11–20> growing direction, slicing the {11–20} GaN single crystal ingot in (0001) planes parallel to the <11–20> growing direction into (0001) seed crystals, obtaining the (0001) seed crystals having surfaces, a bulk between the surfaces, threading dislocations running within the bulk in the <11–20> direction parallel to the (0001) surface, growing a (0001) gallium nitride single crystal ingot in a <0001> growing direction on the (0001) GaN seed crystal, slicing the (0001) GaN single crystal ingot in (0001) planes orthogonal to the <0001> growing direction into (0001) GaN single substrates, obtaining the (0001) GaN single crystal substrates having (0001) surfaces, a bulk between the surfaces and threading dislocations running in the <0001> direction orthogonal to the (0001) surface.

20. The method according to claim 16, comprising growing a {0001} gallium nitride single crystal ingot in a <0001> growing direction, slicing the {0001} GaN single crystal ingot in {1–100} planes parallel to the <0001> growing direction into {1–100} seed crystals, obtaining the {1–100} seed crystals having surfaces, a bulk between the surfaces, threading dislocations running within the bulk in the <0001> direction parallel to the {1–100} surface, growing a {1–100} gallium nitride single crystal ingot in a <1–100> growing direction on the {1–100} GaN seed crystal, slicing the {1–100} GaN single crystal ingot in {1–100} planes orthogonal to the <1–100> growing direction into {1–100} GaN single substrates, obtaining the {1–100} GaN single crystal substrates having {1–100} surfaces, a bulk between the surfaces and threading dislocations running in the <1–100> direction orthogonal to the {1–100} surface.

21. The method according to claim 16, comprising growing a {0001} gallium nitride single crystal ingot in a <0001> growing direction, slicing the {0001} GaN single crystal ingot in {11–20} planes parallel to the <0001> growing direction into {11–20} seed crystals, obtaining the {11–20} seed crystals having surfaces, a bulk between the surfaces, threading dislocations running within the bulk in the <0001> direction parallel to the {11–20} surface, growing a {11–20} gallium nitride single crystal ingot in a <11–20> growing direction on the {11–20} GaN seed crystal, slicing the {11–20} GaN single crystal ingot in {11–20} planes orthogonal to the <1–100> growing direction into {11–20} GaN single substrates, obtaining the {11–20} GaN single crystal substrates having {11–20} surfaces, a bulk between the surfaces and threading dislocations running in the <11–20> direction orthogonal to the {11–20} surface.

* * * * *